(12) United States Patent
Kimoto

(10) Patent No.: US 10,879,273 B2
(45) Date of Patent: Dec. 29, 2020

(54) ACTIVE MATRIX SUBSTRATE

(71) Applicant: Sharp Kabushiki Kaisha, Sakai (JP)

(72) Inventor: Hidenobu Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/455,847

(22) Filed: Jun. 28, 2019

(65) Prior Publication Data

US 2020/0006392 A1  Jan. 2, 2020

Related U.S. Application Data

(60) Provisional application No. 62/692,922, filed on Jul. 2, 2018.

(51) Int. Cl.
*H01L 29/10* (2006.01)
*H01L 27/12* (2006.01)
(Continued)

(52) U.S. Cl.
CPC ........ *H01L 27/1225* (2013.01); *H01L 21/465* (2013.01); *H01L 21/47635* (2013.01);
(Continued)

(58) Field of Classification Search
CPC ............ H01L 27/1255; H01L 27/1251; H01L 27/1248; H01L 27/1259; H01L 27/1288
See application file for complete search history.

(56) References Cited

U.S. PATENT DOCUMENTS

2004/0001167 A1  1/2004  Takeuchi et al.
2010/0060835 A1*  3/2010  Inoue .................... G02F 1/1393
  349/123
(Continued)

FOREIGN PATENT DOCUMENTS

JP  2004-078157 A  3/2004
JP  2012-084859 A  4/2012
(Continued)

*Primary Examiner* — Phuc T Dang
(74) *Attorney, Agent, or Firm* — Keating & Bennett, LLP

(57) ABSTRACT

An active matrix substrate includes a thin film transistor having a gate electrode, an oxide semiconductor layer disposed on the gate electrode via a gate insulating layer, and a source electrode and a drain electrode disposed on the oxide semiconductor layer. A plurality of gate bus lines and the gate electrode are made of a first electrically conductive film. At least part of each of the plurality of source bus lines, the source electrode, and the drain electrode have a multilayer structure including a lower layer that is made of a second electrically conductive film and an upper layer that is made of a first transparent electrically conductive film. Between the plurality of source bus lines and the gate insulating layer, a plurality of first oxide strips extending along the first direction are disposed, the first oxide strips being made of the same oxide semiconductor film as the oxide semiconductor layer. Each of the plurality of source bus lines is located on an upper face of the corresponding first oxide strip, and a width of each of the plurality of source bus lines along a second direction is smaller than a width of one corresponding first oxide strip along the second direction.

20 Claims, 14 Drawing Sheets

(51) Int. Cl.
  *H01L 29/786* (2006.01)
  *H01L 21/465* (2006.01)
  *H01L 29/26* (2006.01)
  *H01L 21/4763* (2006.01)
  *H01L 29/45* (2006.01)

(52) U.S. Cl.
  CPC ........ *H01L 27/124* (2013.01); *H01L 27/1259* (2013.01); *H01L 29/26* (2013.01); *H01L 29/45* (2013.01); *H01L 29/7869* (2013.01)

(56) References Cited

U.S. PATENT DOCUMENTS

| | | |
|---|---|---|
| 2012/0061665 A1 | 3/2012 | Miyake et al. |
| 2012/0138922 A1 | 6/2012 | Yamazaki et al. |
| 2012/0182511 A1 | 7/2012 | Hisada et al. |
| 2013/0234331 A1 | 9/2013 | Okumoto |
| 2013/0271690 A1 | 10/2013 | Matsukizono |
| 2013/0320334 A1 | 12/2013 | Yamazaki et al. |
| 2014/0151682 A1* | 6/2014 | Saito .................. H01L 27/124 257/43 |
| 2014/0286076 A1 | 9/2014 | Aoki et al. |
| 2014/0300852 A1* | 10/2014 | Yoshida ............ G02F 1/136286 349/143 |
| 2014/0340607 A1 | 11/2014 | Nakata et al. |
| 2015/0124188 A1 | 5/2015 | Kadowaki et al. |
| 2015/0234249 A1* | 8/2015 | Nakamura .............. G02F 1/172 359/296 |
| 2016/0247831 A1* | 8/2016 | Makita ................ H01L 27/1274 |
| 2016/0358567 A1* | 12/2016 | Tomida ............ H01L 29/78606 |
| 2017/0062750 A1* | 3/2017 | Jung .................... H01L 51/5278 |
| 2017/0139298 A1 | 5/2017 | Kimoto et al. |

FOREIGN PATENT DOCUMENTS

| | | |
|---|---|---|
| JP | 2012-134475 A | 7/2012 |
| JP | 2013-190456 A | 9/2013 |
| JP | 2014-007399 A | 1/2014 |
| JP | 2014-209727 A | 11/2014 |
| JP | 2015-148638 A | 8/2015 |
| WO | 2011/040080 A1 | 4/2011 |
| WO | 2012/090794 A1 | 7/2012 |
| WO | 2013/042608 A1 | 3/2013 |
| WO | 2013/073635 A1 | 5/2013 |
| WO | 2016/021320 A1 | 2/2016 |

* cited by examiner

FIG.3B
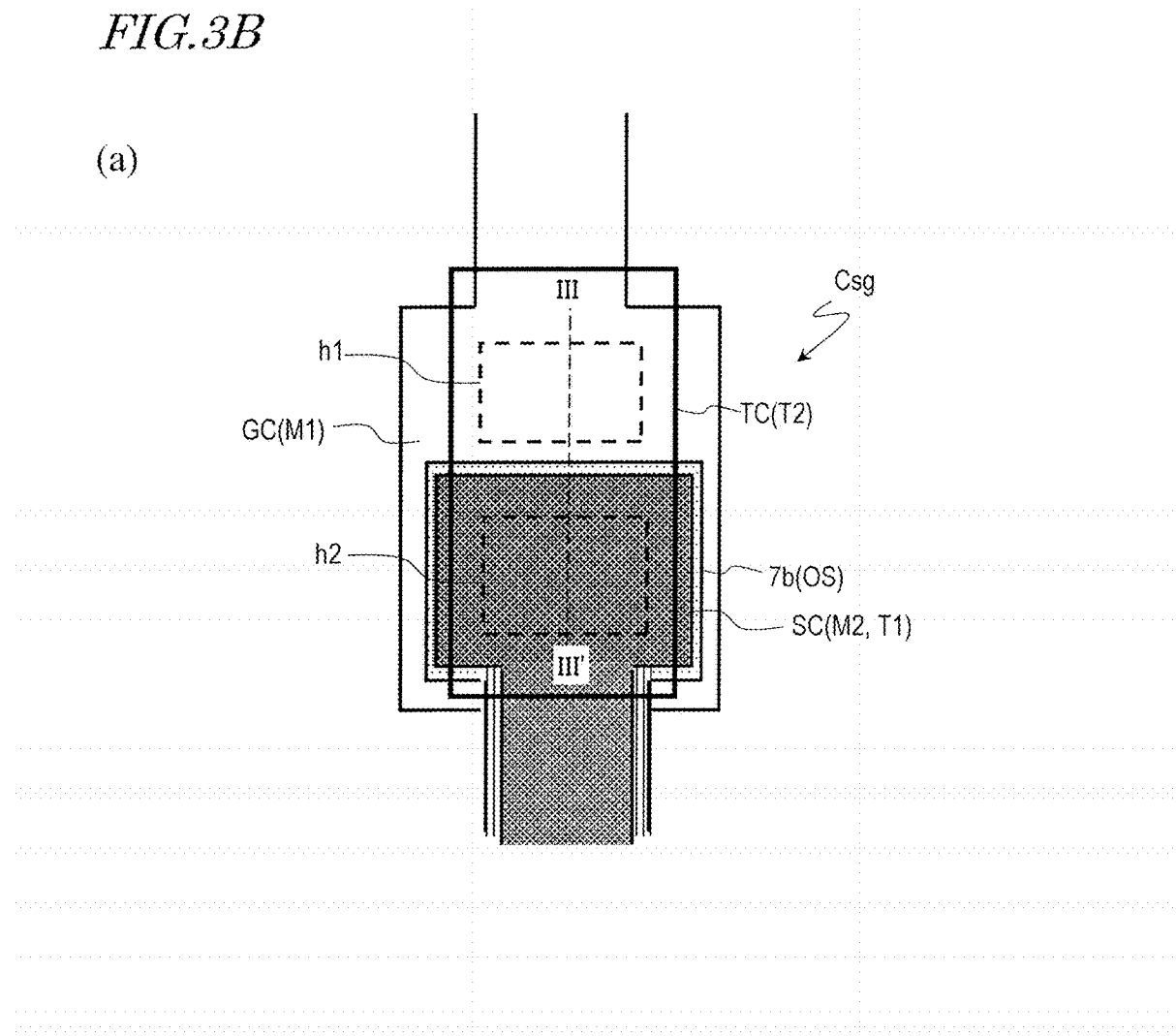
(a)
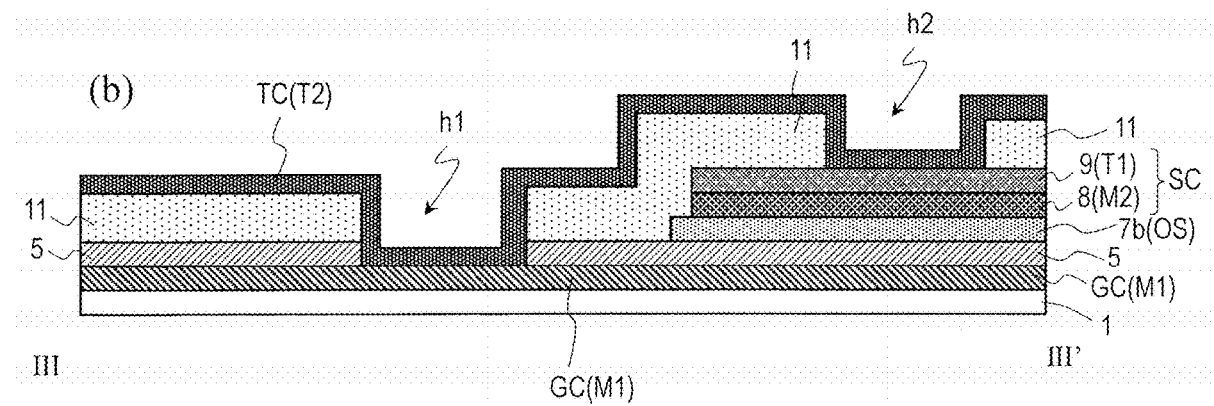
(b)

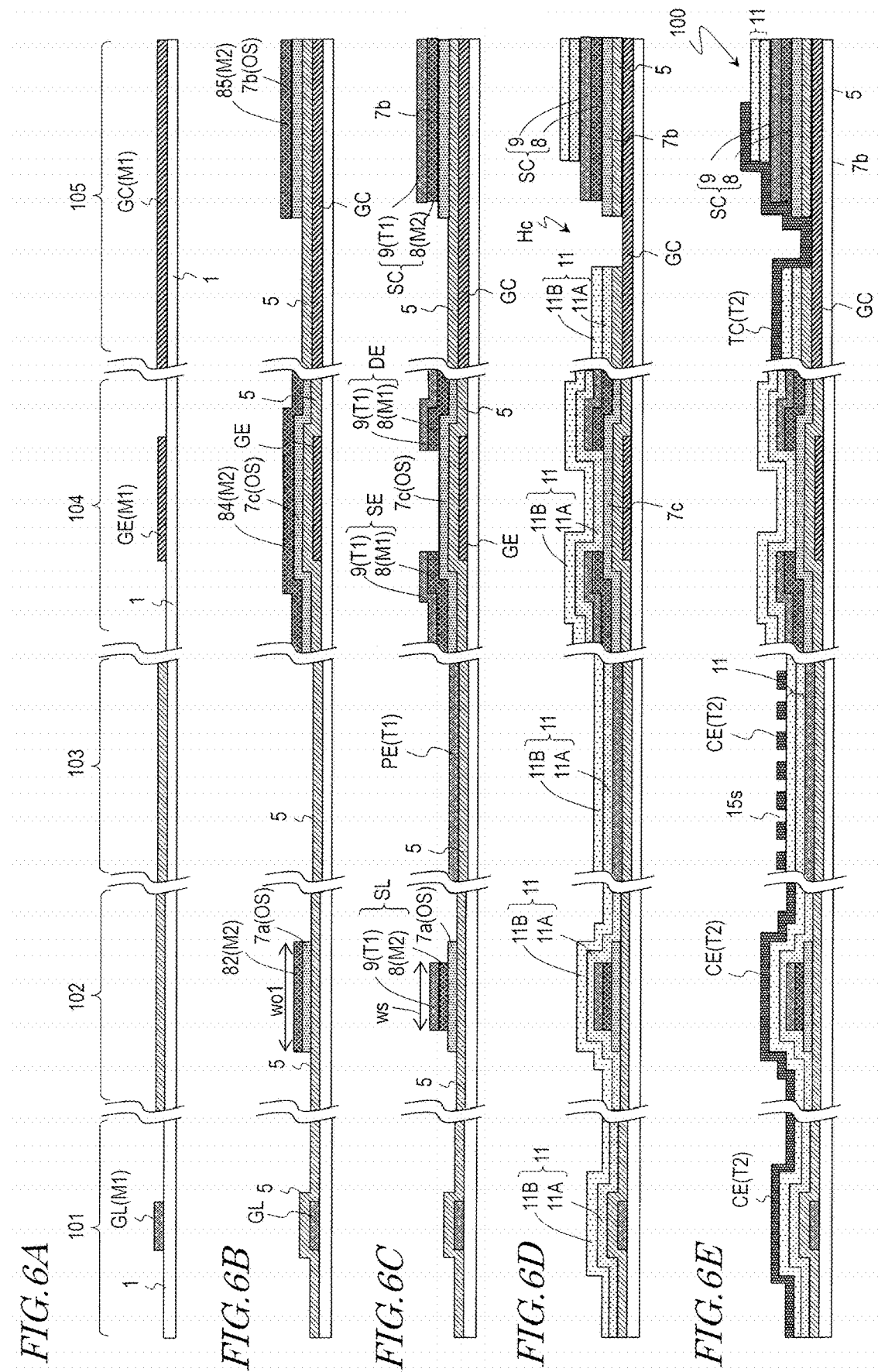

FIG. 7

| STEP 1 | FORM FIRST ELECTRICALLY CONDUCTIVE FILM | TiN/Al/Ti |
|---|---|---|
| | FIRST PHOTOLITHOGRAPHY STEP | |
| | WET OR DRY ETCHING | FORM GATE BUS LINES AND GATE ELECTRODES |
| | REMOVE RESIST | |
| STEP 2 | FORM GATE DIELECTRIC LAYER | SiO2/SiNx |
| | FORM OXIDE SEMICONDUCTOR FILM | In-Ga-Zn-O |
| | FORM SECOND ELECTRICALLY CONDUCTIVE FILM | Ti/Al/Ti |
| | SECOND PHOTOLITHOGRAPHY STEP | |
| | DRY ETCHING | FORM PRELIMINARY SOURCE BUS LINES AND ELECTRODE LAYER |
| | WET ETCHING (OXALIC ACID) | FORM OXIDE SEMICONDUCTOR LAYER AND OXIDE STRIPS |
| | REMOVE RESIST | |
| STEP 3 | FORM FIRST TRANSPARENT ELECTRICALLY CONDUCTIVE FILM | ITO OR IZO |
| | THIRD PHOTOLITHOGRAPHY STEP | |
| | WET ETCHING (OXALIC ACID) | FORM UPPER LAYER (PIXEL ELECTRODES AND SOURCE BUS LINES, ETC.) |
| | DRY ETCHING | FORM LOWER LAYER (SOURCE BUS LINES, ETC.) |
| | REMOVE RESIST | |
| STEP 4 | FORM INTERLEVEL DIELECTRIC LAYER | SiNx/SiO2 |
| | FOURTH PHOTOLITHOGRAPHY STEP | |
| | DRY ETCHING | MAKE OPENINGS IN INTERLEVEL DIELECTRIC LAYER AND GATE DIELECTRIC LAYER |
| | REMOVE RESIST | |
| STEP 5 | FORM SECOND TRANSPARENT ELECTRICALLY CONDUCTIVE FILM | ITO OR IZO |
| | FIFTH PHOTOLITHOGRAPHY STEP | |
| | WET ETCHING | FORM COMMON ELECTRODE AND UPPER CONNECTING PORTIONS |
| | REMOVE RESIST | |

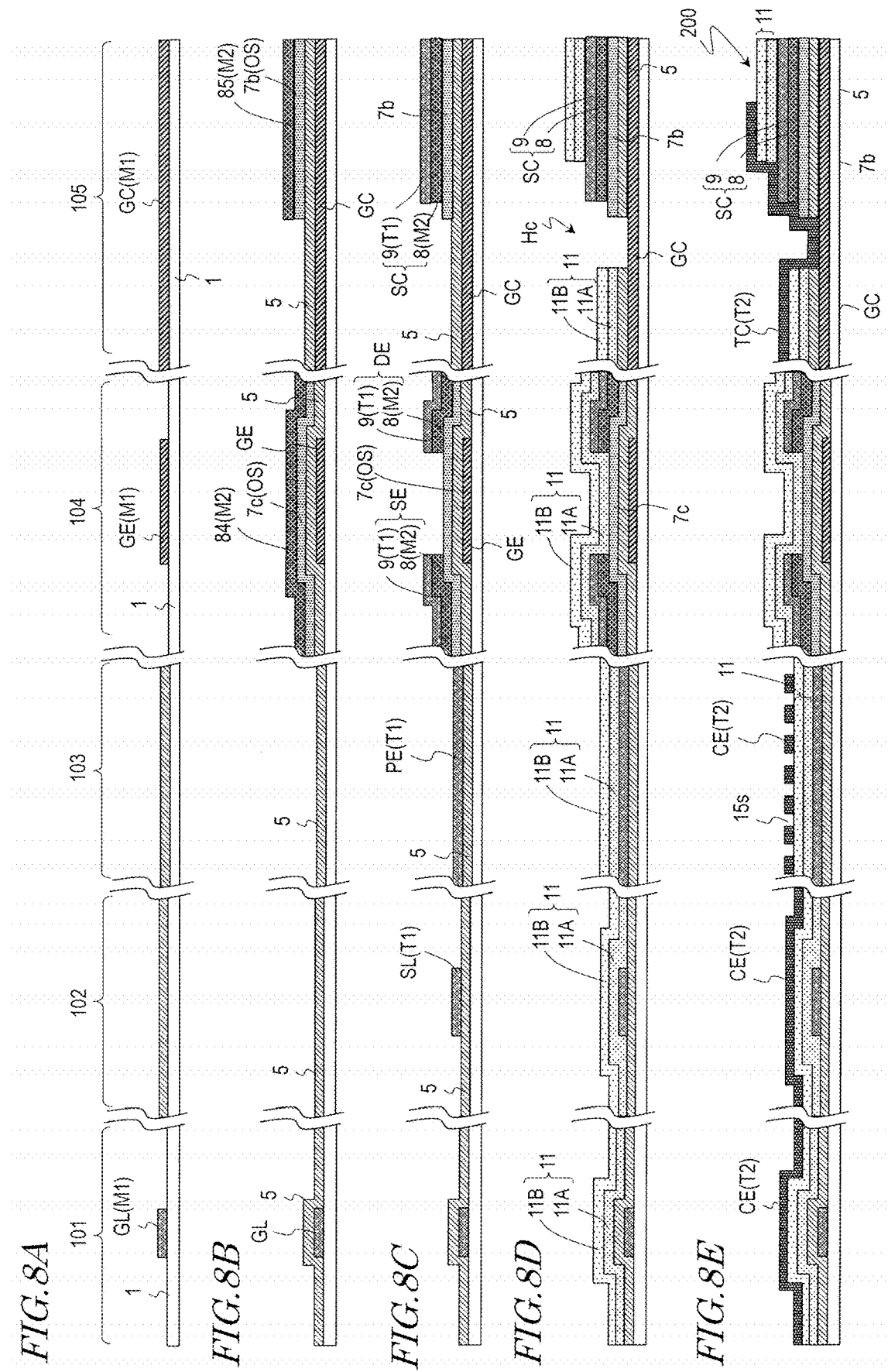

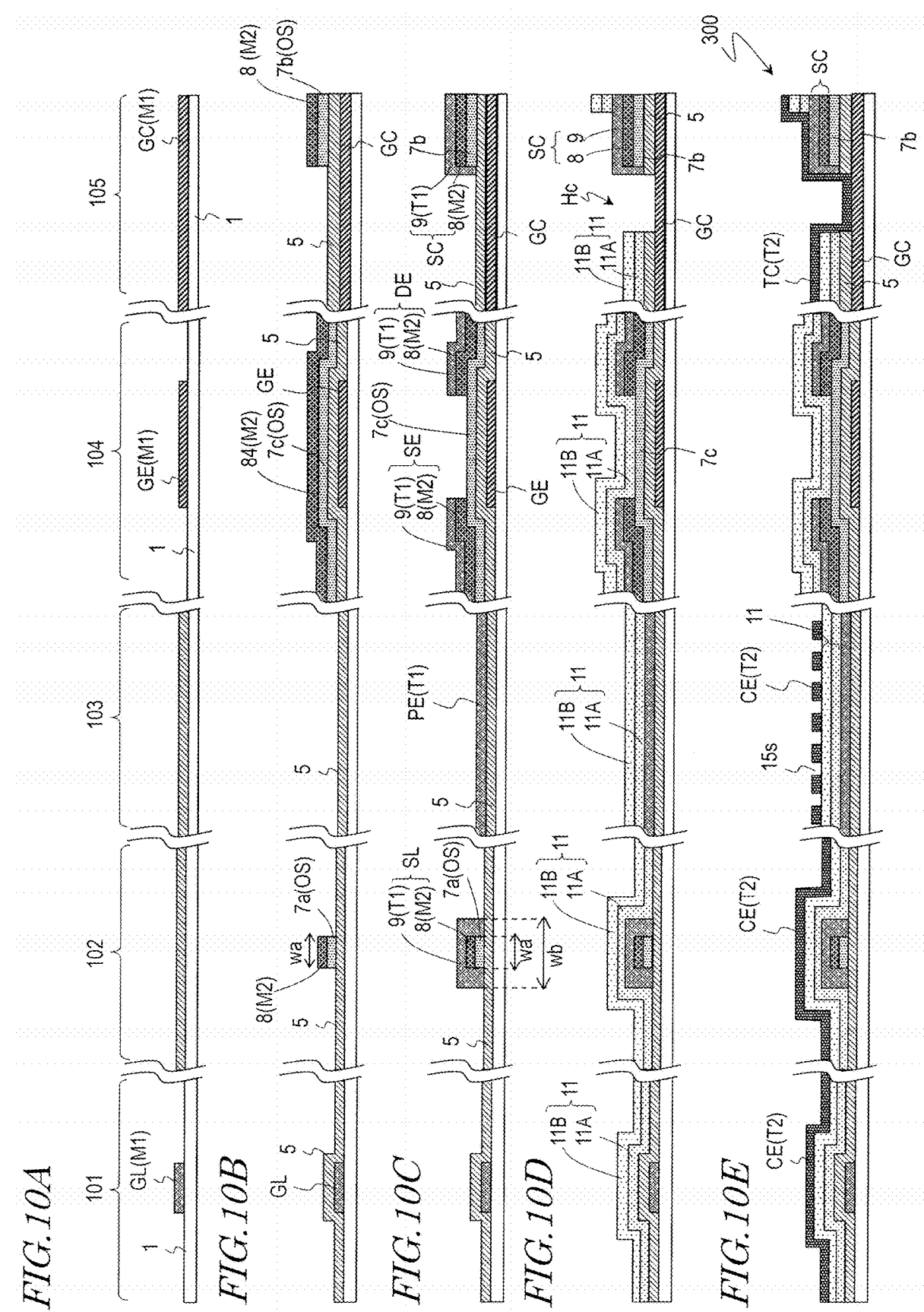

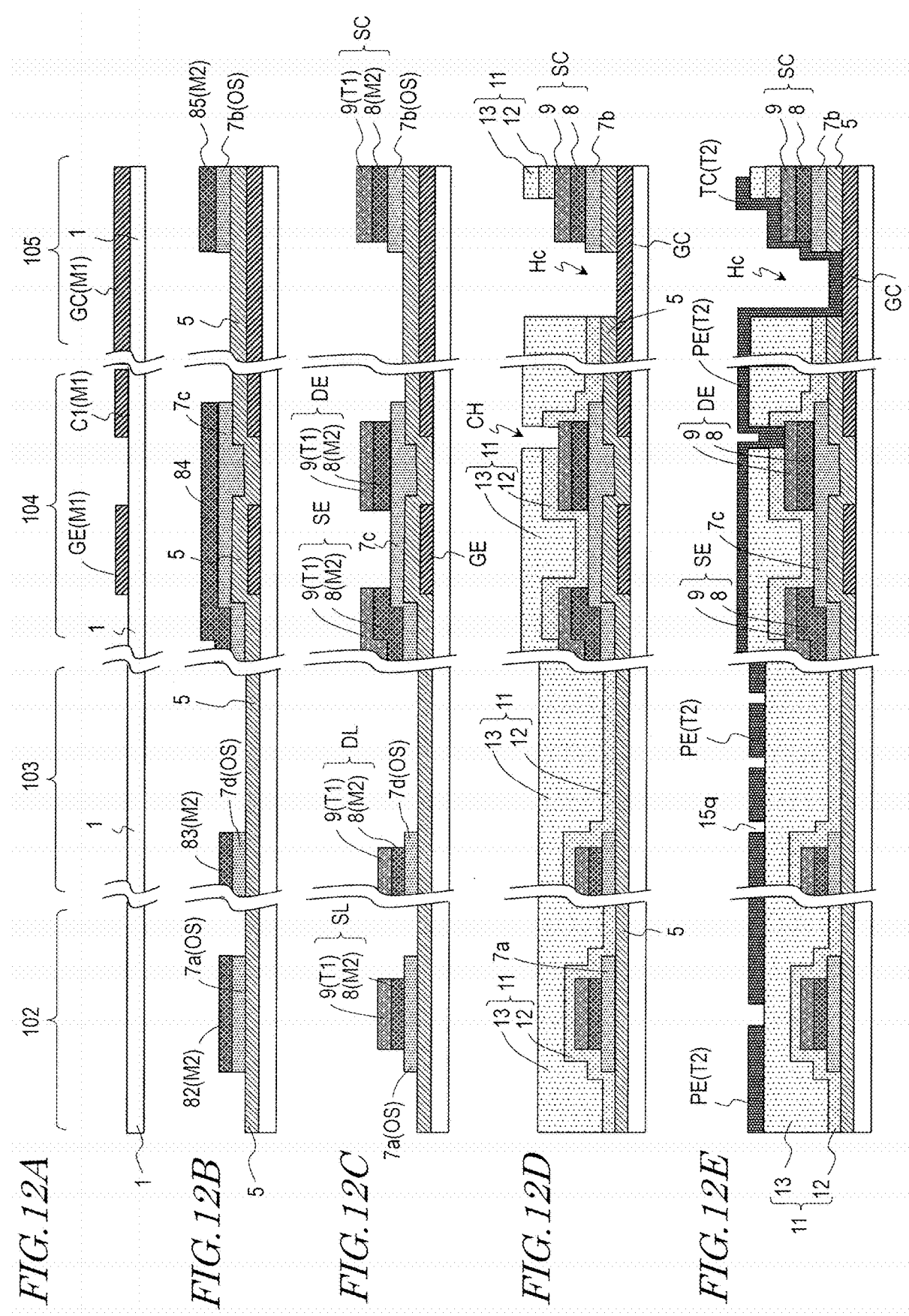

FIG. 13

| STEP 1 | FORM FIRST ELECTRICALLY CONDUCTIVE FILM | TiN/Al/Ti |
|---|---|---|
| | FIRST PHOTOLITHOGRAPHY STEP | |
| | WET OR DRY ETCHING | FORM GATE BUS LINES AND GATE ELECTRODES |
| | REMOVE RESIST | |
| STEP 2 | FORM GATE DIELECTRIC LAYER | SiO2/SiNx |
| | FORM OXIDE SEMICONDUCTOR FILM | In-Ga-Zn-O |
| | FORM SECOND ELECTRICALLY CONDUCTIVE FILM | Ti/Al/Ti |
| | SECOND PHOTOLITHOGRAPHY STEP | |
| | DRY ETCHING | FORM PRELIMINARY SOURCE BUS LINES AND ELECTRODE LAYER |
| | WET ETCHING (OXALIC ACID) | FORM OXIDE SEMICONDUCTOR LAYER AND OXIDE STRIPS |
| | REMOVE RESIST | |
| STEP 3 | FORM FIRST TRANSPARENT ELECTRICALLY CONDUCTIVE FILM | ITO OR IZO |
| | THIRD PHOTOLITHOGRAPHY STEP | |
| | WET ETCHING (OXALIC ACID) | FORM UPPER LAYER (SOURCE BUS LINES, ETC.) |
| | DRY ETCHING | FORM LOWER LAYER (SOURCE BUS LINES, ETC.) |
| | REMOVE RESIST | |
| STEP 4 | FORM INTERLEVEL DIELECTRIC LAYER | SiNx/SiO2 |
| | FOURTH PHOTOLITHOGRAPHY STEP | |
| | DRY ETCHING | MAKE OPENINGS IN INTERLEVEL DIELECTRIC LAYER AND GATE DIELECTRIC LAYER |
| | REMOVE RESIST | |
| STEP 5 | FORM SECOND TRANSPARENT ELECTRICALLY CONDUCTIVE FILM | ITO OR IZO |
| | FIFTH PHOTOLITHOGRAPHY STEP | |
| | WET ETCHING | FORM PIXEL ELECTRODES AND UPPER CONNECTING PORTIONS |
| | REMOVE RESIST | |

ACTIVE MATRIX SUBSTRATE

BACKGROUND

1. Technical Field

The present invention relates to an active matrix substrate and a method of producing an active matrix substrate.

2. Description of the Related Art

An active-matrix type liquid crystal display device generally includes: a substrate having a thin film transistor (hereinafter also referred to as a "TFT") formed as a switching element for each pixel thereof (hereinafter referred to as an "active matrix substrate"); a counter substrate on which a counter electrode, color filters, and the like are formed; a liquid crystal layer provided between the active matrix substrate and the counter substrate; and a pair of electrodes for applying a voltage across the liquid crystal layer.

Depending on their applications, various operation modes have been proposed and adopted for active-matrix type liquid crystal display devices. Examples of operation modes include a TN (Twisted Nematic) mode, a VA (Vertical Alignment) mode, an IPS (In-Plane-Switching) mode, an FFS (Fringe Field Switching) mode, and so on.

Among these, the TN mode and the VA mode are modes under the vertical field method, where an electric field is applied across liquid crystal molecules by a pair of electrodes between which the liquid crystal layer is interposed. The IPS mode and the FFS mode are modes under the lateral field method, where a pair of electrodes are provided on one of the substrates, and an electric field is applied across the liquid crystal molecules from a direction which is parallel to the substrate plane (lateral direction). Under the lateral field method, the liquid crystal molecules do not rise from the substrate, which provides an advantage of realizing a broader viewing angle than is possible under the vertical field method.

In recent years, it has been proposed to use an oxide semiconductor, instead of a silicon semiconductor, to form the active layer of a TFT. Such a TFT is referred to as an "oxide semiconductor TFT". An oxide semiconductor provides a higher mobility than does an amorphous silicon. Therefore, an oxide semiconductor TFT is able to operate more rapidly than an amorphous silicon TFT.

For example, International Publication No. 2013/073635 (hereinafter, "Patent Document 1") discloses a process in which oxide semiconductor TFTs are used as switching elements in providing an active matrix substrate for use in a liquid crystal display device of the FFS mode. In this fabrication process, eight photolithography steps are performed (i.e., eight photomasks are used) (see e.g. FIG. 6 of Patent Document 1). A process where eight photomasks are thus required may be referred to as an "8-mask process".

SUMMARY

In order to enhance the producibility of an active matrix substrate in which oxide semiconductor TFTs are used, it is desired to further reduce the number of photomasks that are needed to produce an active matrix substrate, thus reducing the production cost. Also, a process that produces, with a good production yield, an active matrix substrate in which oxide semiconductor TFTs are used is also desired.

An embodiment of the present invention has an objective of providing an active matrix substrate with good producibility. Another objective thereof is to provide a method of producing an active matrix substrate which can reduce the production cost and/or improve the production yield.

The present specification discloses active matrix substrates and methods of producing an active matrix substrate as recited in the following Items.

[Item 1]

An active matrix substrate having a displaying region that includes a plurality of pixel regions and a non-displaying region excluding the displaying region, the active matrix substrate comprising:

a substrate;

a plurality of source bus lines extending along the first direction and a plurality of gate bus lines extending along a second direction which intersects the first direction, the source bus lines and the gate bus lines being supported on the substrate; and a thin film transistor disposed in each of the plurality of pixel regions, wherein, each thin film transistor includes a gate electrode, an oxide semiconductor layer disposed on the gate electrode via a gate insulating layer, and a source electrode and a drain electrode being disposed on the oxide semiconductor layer and electrically connected to the oxide semiconductor layer;

the plurality of gate bus lines and the gate electrode are made of a first electrically conductive film;

at least part of each of the plurality of source bus lines, the source electrode, and the drain electrode have a multilayer structure including a lower layer that is made of a second electrically conductive film and an upper layer that is made of a first transparent electrically conductive film;

the active matrix substrate further includes a pixel electrode disposed in each of the plurality of pixel regions and a common electrode disposed on the pixel electrode via an interlevel insulating layer, the pixel electrode being made of the first transparent electrically conductive film and the common electrode being made of a second transparent electrically conductive film; or further includes, in each of the plurality of pixel regions, a pixel electrode disposed on the thin film transistor via an interlevel insulating layer, the pixel electrode being made of a second transparent electrically conductive film; and a plurality of first oxide strips are disposed between the plurality of source bus lines and the gate insulating layer, the plurality of first oxide strips being made of a same oxide semiconductor film as the oxide semiconductor layer and extending along the first direction, each of the plurality of source bus lines being located on an upper face of one corresponding first oxide strip among the plurality of first oxide strips, and a width of the each of the plurality of source bus lines along the second direction is smaller than a width of the one corresponding first oxide strip along the second direction.

[Item 2]

An active matrix substrate having a displaying region that includes a plurality of pixel regions and a non-displaying region excluding the displaying region, the active matrix substrate comprising:

a substrate;

a plurality of source bus lines extending along the first direction and a plurality of gate bus lines extending along a second direction which intersects the first direction, the source bus lines and the gate bus lines being supported on the substrate; and a thin film transistor disposed in each of the plurality of pixel regions, wherein, each thin film transistor includes a gate electrode, an oxide semiconductor layer disposed on the gate electrode via a gate insulating layer, and a source electrode and a drain electrode being disposed on the oxide semiconductor layer and electrically connected to the oxide semiconductor layer;

the plurality of gate bus lines and the gate electrode are made of a first electrically conductive film;

at least part of each of the plurality of source bus lines, the source electrode, and the drain electrode have a multilayer structure including a lower layer that is made of a second electrically conductive film and an upper layer that is made of a first transparent electrically conductive film;

the active matrix substrate further includes a pixel electrode disposed in each of the plurality of pixel regions and a common electrode disposed on the pixel electrode via an interlevel insulating layer, the pixel electrode being made of the first transparent electrically conductive film and the common electrode being made of a second transparent electrically conductive film; or further includes, in each of the plurality of pixel regions, a pixel electrode disposed on the thin film transistor via an interlevel insulating layer, the pixel electrode being made of a second transparent electrically conductive film; and a plurality of first oxide strips are disposed between the plurality of source bus lines and the gate insulating layer, the plurality of first oxide strips being made of a same oxide semiconductor film as the oxide semiconductor layer and extending along the first direction, and in each of the plurality of source bus lines, the lower layer is located on an upper face of one corresponding first oxide strip among the plurality of first oxide strips, and the upper layer covers an upper face and a side face of the lower layer and a side face of the one corresponding first oxide strip and is in contact with the gate insulating layer.

[Item 3]

The active matrix substrate of Item 1 or 2, further comprising a plurality of source-gate connecting portions disposed in the non-displaying region, wherein, each of the plurality of source-gate connecting portions includes a gate connecting portion made of the first electrically conductive film, a source connecting portion having the multilayer structure, a second oxide strip being disposed between the source connecting portion and the gate insulating layer, and being made of the oxide semiconductor film, and an upper connecting portion being made of the second transparent electrically conductive film and connecting between the gate connecting portion and the source connecting portion;

the upper connecting portion is directly in contact with the gate connecting portion, the second oxide strip, and the source connecting portion, within an opening that is made in the interlevel insulating layer and the gate insulating layer; and when viewed from a normal direction of the substrate, within the opening, an edge of the second oxide strip is located inward of an edge of the source connecting portion.

[Item 4]

The active matrix substrate of Item 3, wherein the upper connecting portion is disposed only within the opening, and is not in contact with an upper face of the interlevel insulating layer.

[Item 5]

The active matrix substrate of any of Items 1 to 4, wherein at least one of the plurality of source bus lines includes a first source portion having the multilayer structure and a second source portion that includes the upper layer but not the lower layer.

[Item 6]

The active matrix substrate of Item 5, wherein the first source portion is located in the non-displaying region, and the second source portion is located in the displaying region.

[Item 7]

The active matrix substrate of Item 5, wherein, in each of the plurality of source bus lines, when viewed from a normal direction of the substrate, the first source portion is disposed in a region that is located between adjacent ones of the plurality of gate bus lines, and the second source portion is disposed in a region that intersects the plurality of gate bus lines.

[Item 8]

The active matrix substrate of Item 1 or 2, wherein, the pixel electrode is made of the second transparent electrically conductive film, and is in contact with the drain electrode within a pixel aperture that is made in the interlevel insulating layer, the active matrix substrate further comprises an extension from the drain electrode, the drain electrode and/or the extension includes a first drain portion having the multilayer structure and a second drain portion that includes the upper layer but not the lower layer.

[Item 9]

The active matrix substrate of any of Items 1 to 8, wherein the interlevel insulating layer is a multilayer film including a silicon oxide layer that is in contact with a channel region of the oxide semiconductor layer and a silicon nitride layer that is disposed on the silicon oxide layer.

[Item 10]

The active matrix substrate of any of Items 1 to 9, wherein the oxide semiconductor film comprises an In—Ga—Zn—O based semiconductor.

[Item 11]

The active matrix substrate of Item 10, wherein the In—Ga—Zn—O based semiconductor includes a crystalline portion.

[Item 12]

A method of producing the active matrix substrate of Item 3, wherein, patterning of the first electrically conductive film is performed through a first photolithography step using a first photomask;

a first patterning of the second electrically conductive film and patterning of the oxide semiconductor film are performed through a second photolithography step using a second photomask;

patterning of the first transparent electrically conductive film and a second patterning of the second electrically conductive film are performed through a third photolithography step using a third photomask;

patterning of the interlevel insulating layer and the gate insulating layer is performed through a fourth photolithography step using a fourth photomask, by utilizing the second oxide strips as etchstops; and patterning of the second transparent electrically conductive film is performed through a fifth photolithography step using a fifth photomask.

[Item 13]

A method of producing an active matrix substrate having a displaying region that includes a plurality of pixel regions and a non-displaying region excluding the displaying region, the active matrix substrate including: a plurality of source bus lines and a plurality of gate bus lines; a thin film transistor and a pixel electrode disposed in each of the plurality of pixel regions; and a common electrode, the method comprising:

(a) a step of forming, on the substrate, a first electrically conductive film, and thereafter patterning the first electrically conductive film to form a gate metal layer that includes the plurality of gate bus lines and a gate electrode of each thin film transistor, and forming a gate insulating layer covering the gate metal layer;

(b) a step of forming an oxide semiconductor film and a second electrically conductive film in this order on the gate insulating layer, and thereafter patterning the second electrically conductive film and the oxide semiconductor film, where, in a transistor formation region in which to form the each thin film transistor, an electrode layer to become a source/drain of the thin film transistor is formed from the second electrically conductive film, and an oxide semiconductor layer to become an active layer of the thin film transistor is formed from the oxide semiconductor film, and, in a source bus line formation region in which to form the plurality of source bus lines, a plurality of preliminary source bus lines having a first width are formed from the second electrically conductive film, and a plurality of first oxide strips having the first width are formed from the oxide semiconductor film;

(c) a step of forming a first transparent electrically conductive film that covers the plurality of preliminary source bus lines and the electrode layer, and thereafter patterning the first transparent electrically conductive film, the plurality of preliminary source bus lines, and the electrode layer, and forming a source electrode and a drain electrode of the each thin film transistor to obtain the thin film transistor and to obtain the pixel electrode and the plurality of source bus lines, wherein at least part of each of the plurality of source bus lines, the source electrode, and the drain electrode have a multilayer structure including a lower layer and an upper layer, the pixel electrode is formed from the first transparent electrically conductive film, in the transistor formation region, the upper layer of the source electrode and the upper layer of the drain electrode are formed from the first transparent electrically conductive film, and the lower layer of the source electrode and the lower layer of the drain electrode are formed from the electrode layer, in the source bus line formation region, the upper layer of the plurality of source bus lines is formed from the first transparent electrically conductive film, the lower layer of the plurality of source bus lines is formed from the plurality of preliminary source bus lines, the lower layer of each of the plurality of source bus lines having a second width which is smaller than the first width;

(d) a step of forming an interlevel insulating layer that covers the thin film transistor and the plurality of source bus lines; and (e) a step of forming a second transparent electrically conductive film on the interlevel insulating layer, and patterning the second transparent electrically conductive film to form the common electrode.

[Item 14]

A method of producing an active matrix substrate having a displaying region that includes a plurality of pixel regions and a non-displaying region excluding the displaying region, the active matrix substrate including: a plurality of source bus lines and a plurality of gate bus lines; and a thin film transistor and a pixel electrode disposed in each of the plurality of pixel regions, the method comprising:

(a) a step of forming, on the substrate, a first electrically conductive film, and thereafter patterning the first electrically conductive film to form a gate metal layer that includes the plurality of gate bus lines and a gate electrode of each thin film transistor, and forming a gate insulating layer covering the gate metal layer;

(b) a step of forming an oxide semiconductor film and a second electrically conductive film in this order on the gate insulating layer, and thereafter patterning the second electrically conductive film and the oxide semiconductor film, where, in a transistor formation region in which to form the each thin film transistor, an electrode layer to become a source/drain of the thin film transistor is formed from the second electrically conductive film, and an oxide semiconductor layer to become an active layer of the thin film transistor is formed from the oxide semiconductor film, and, in a source bus line formation region in which to form the plurality of source bus lines, a plurality of preliminary source bus lines having a first width are formed from the second electrically conductive film, and a plurality of first oxide strips having the first width are formed from the oxide semiconductor film;

(c) a step of forming a first transparent electrically conductive film that covers the plurality of preliminary source bus lines and the electrode layer, and thereafter patterning the first transparent electrically conductive film, the plurality of preliminary source bus lines, and the electrode layer, and forming a source electrode and a drain electrode of the each thin film transistor to obtain the thin film transistor and to obtain the plurality of source bus lines, wherein at least part of each of the plurality of source bus lines, at least part of the drain electrode, and the source electrode have a multilayer structure including a lower layer and an upper layer, in the transistor formation region, the upper layer of the source electrode and the upper layer of the drain electrode are formed from the first transparent electrically conductive film, and the lower layer of the source electrode and the lower layer of the drain electrode are formed from the electrode layer, and, in the source bus line formation region, the upper layer of the plurality of source bus lines is formed from the first transparent electrically conductive film, the lower layer of the plurality of source bus lines is formed from the plurality of preliminary source bus lines, the lower layer of each of the plurality of source bus lines having a second width which is smaller than the first width;

(d) a step of forming an interlevel insulating layer that covers the thin film transistor and the plurality of source bus lines, and forming in the interlevel insulating layer a pixel aperture through which to expose a portion of the drain electrode; and (e) a step of forming a second transparent electrically conductive film on the interlevel insulating layer and within the pixel aperture, and patterning the second transparent electrically conductive film to form the pixel electrode so as to be in contact with the portion of the drain electrode within the pixel aperture.

[Item 15]

The method of producing an active matrix substrate of Item 13 or 14, wherein, in step (b), after the second electrically conductive film is patterned through dry etching, the oxide semiconductor film is patterned through wet etching using oxalic acid.

[Item 16]

The method of producing an active matrix substrate of any of Items 13 to 15, wherein, in step (c), after the first transparent electrically conductive film is patterned through wet etching using oxalic acid, the plurality of preliminary source bus lines and the electrode layer are patterned through dry etching.

[Item 17]

The method of producing an active matrix substrate of any of Items 13 to 16, wherein, the active matrix substrate further includes source-gate connecting portions that are disposed in the non-displaying region;

in step (a), the gate metal layer includes a gate connecting portion that is disposed in a source-gate connecting portion formation region in which to form each source-gate connecting portion;

step (b) comprises a step of, in each source-gate connecting portion formation region: forming a preliminary source connecting portion from the second electrically conductive film; and forming a second oxide strip from the oxide semiconductor film, the second oxide strip being located on the substrate side of the preliminary source connecting portion;

step (c) comprises a step of forming a source connecting portion having the multilayer structure in the each source-gate connecting portion formation region, wherein the lower layer of the source connecting portion is formed from the preliminary source connecting portion, the upper layer of the source connecting portion is formed from the first transparent electrically conductive film, and when viewed from a normal direction of the substrate, the lower layer of the source connecting portion and the upper layer are located inward of the second oxide strip;

step (d) comprises a step of, in the each source-gate connecting portion formation region, patterning the interlevel insulating layer and the gate insulating layer by utilizing the second oxide strip as an etchstop to make an opening through which to expose at least part of the gate connecting portion, at least part of the second oxide strip, and at least part of the source connecting portion; and step (e) comprises a step of, through patterning of the second transparent electrically conductive film, forming an upper connecting portion that is directly in contact with the source connecting portion and the gate connecting portion within the opening in the each source-gate connecting portion formation region.

[Item 18]

The method of producing an active matrix substrate of any of Items 13 to 17, wherein, at least one of the plurality of source bus lines includes a first source portion having the multilayer structure and a second source portion that includes the upper layer but not the lower layer; and the plurality of preliminary source bus lines and the first oxide strip are not formed in any region where the second source portion is disposed.

[Item 19]

The method of producing an active matrix substrate of any of Items 13 to 18, wherein the oxide semiconductor film comprises an In—Ga—Zn—O based semiconductor.

[Item 20]

The method of producing an active matrix substrate of Item 19, wherein the In—Ga—Zn—O based semiconductor includes a crystalline portion.

According to one embodiment of the present invention, an active matrix substrate with good producibility is provided. Moreover, a method of producing an active matrix substrate which can reduce the production cost and/or improve the production yield is provided.

BRIEF DESCRIPTION OF THE DRAWINGS

FIG. 3B A diagram illustrating another source-gate connecting portion Csg according to Embodiment 1, including portions: (a) a plan view; and (b) a cross-sectional view as taken along line III-III' in (a).

FIG. 6A A step-by-step cross-sectional view for describing a method of producing the active matrix substrate 100.

FIG. 6B A step-by-step cross-sectional view for describing a method of producing the active matrix substrate 100.

FIG. 6C A step-by-step cross-sectional view for describing a method of producing the active matrix substrate 100.

FIG. 6D A step-by-step cross-sectional view for describing a method of producing the active matrix substrate 100.

FIG. 6E A step-by-step cross-sectional view for describing a method of producing the active matrix substrate 100.

FIG. 7 A diagram showing the flow of a method of producing the active matrix substrate 100.

FIG. 8A A step-by-step cross-sectional view for describing a method of producing an active matrix substrate 200 according to Variant 1.

FIG. 8B A step-by-step cross-sectional view for describing a method of producing the active matrix substrate 200 according to Variant 1.

FIG. 8C A step-by-step cross-sectional view for describing a method of producing the active matrix substrate 200 according to Variant 1.

FIG. 8D A step-by-step cross-sectional view for describing a method of producing the active matrix substrate 200 according to Variant 1.

FIG. 8E A step-by-step cross-sectional view for describing a method of producing the active matrix substrate 200 according to Variant 1.

FIG. 10A A step-by-step cross-sectional view for describing a method of producing an active matrix substrate 300 according to Variant 3.

FIG. 10B A step-by-step cross-sectional view for describing a method of producing the active matrix substrate 300 according to Variant 3.

FIG. 10C A step-by-step cross-sectional view for describing a method of producing the active matrix substrate 300 according to Variant 3.

FIG. 10D A step-by-step cross-sectional view for describing a method of producing the active matrix substrate 300 according to Variant 3.

FIG. 10E A step-by-step cross-sectional view for describing a method of producing the active matrix substrate 300 according to Variant 3.

FIG. 12A A step-by-step cross-sectional view for describing a method of producing an active matrix substrate 400.

FIG. 12B A step-by-step cross-sectional view for describing a method of producing the active matrix substrate 400.

FIG. 12C A step-by-step cross-sectional view for describing a method of producing the active matrix substrate 400.

FIG. 12D A step-by-step cross-sectional view for describing a method of producing the active matrix substrate 400.

FIG. 12E A step-by-step cross-sectional view for describing a method of producing the active matrix substrate 400.

FIG. 13 A diagram showing the flow of a method of producing the active matrix substrate 400.

DETAILED DESCRIPTION

Hereinafter, with reference to the drawings, active matrix substrates and methods of producing the same according to embodiments of the present invention will be described.

Embodiment 1

An active matrix substrate according to Embodiment 1 is an active matrix substrate for use in a liquid crystal display device of the FFS mode, for example. Note that an active matrix substrate according to the present embodiment may at least include TFTs and two transparent conductive layers on a substrate, and it broadly encompasses active matrix substrates for use in liquid crystal display devices of other operation modes, various display devices other than liquid crystal display devices, electronic appliances, and the like.

Figure 1:
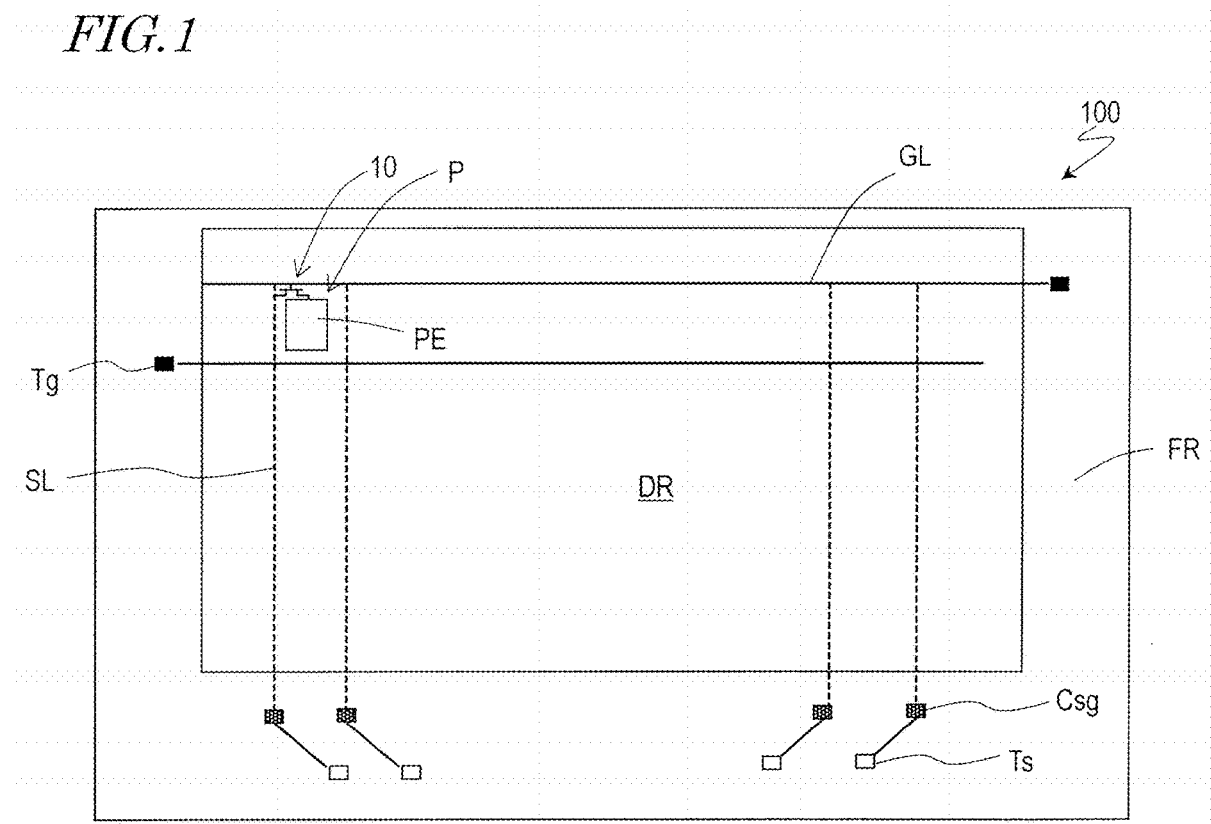
FIG. 1 A diagram schematically showing an example planar structure of an active matrix substrate 100 according to Embodiment 1.

FIG. 1 is a diagram schematically showing an exemplary planar structure of an active matrix substrate 100 according to the present embodiment. The active matrix substrate 100 includes a displaying region DR, which contributes to displaying, and a peripheral region (frame region) FR that is located outside the displaying region DR.

In the displaying region DR, a plurality of source bus lines (data lines) SL extending along a first direction and a plurality of gate bus lines (gate lines) GL extending along a second direction which intersects (e.g., being orthogonal to in this example) the first direction. Each region that is surrounded by these bus lines defines a "pixel region P". The pixel regions P are regions corresponding to pixels of a display device, and therefore may also be referred to as "pixels". The plurality of pixel regions P are arranged in a matrix shape. In each pixel region P, a pixel electrode PE and a thin film transistor (TFT) 10 are formed. A gate electrode of each TFT 10 is electrically connected to a corresponding gate bus line GL, while a source electrode of each TFT 10 is electrically connected to a corresponding source bus line SL. Moreover, a drain electrode of each TFT 10 is electrically connected to the pixel electrode PE. In the present embodiment, a common electrode (not shown) opposing the pixel electrode PE is provided above the pixel electrode PE, via a dielectric layer (insulating layer).

In the peripheral region FR, a plurality of gate terminal portions Tg, a plurality of source terminal portions Ts, a plurality of source-gate connecting portions Csg, and the like are disposed. Each gate bus line GL is connected to a gate driver (not shown) via a corresponding gate terminal portion Tg. Each source bus line SL is connected to a source driver (not shown) via a corresponding source terminal portion Ts. The gate driver(s) and the source driver(s) may be monolithically formed on the active matrix substrate 100, or mounted on the active matrix substrate 100.

Each source-gate connecting portion Csg is a junction between: a source bus line SL (or any wiring line that is made of the same electrically conductive film as a source bus line SL); and a wiring line that is made of the same electrically conductive film as a gate bus line GL. As shown in the figure, a source-gate connecting portion Csg may be disposed between each source bus line SL and each source terminal portion Ts, for example, thus allowing the source bus line SL to be connected to a connection line (gate connection line) that is made of the same electrically conductive film as the gate bus line GL. The gate connection line is connected to the source driver via the source terminal portion Ts. In this case, the source terminal portion Ts may be similar in structure to the gate terminal portion Tg.

Next, each region of the active matrix substrate 100 according to the present embodiment will be described more specifically.

<Pixel Region P>

Figure 2A:
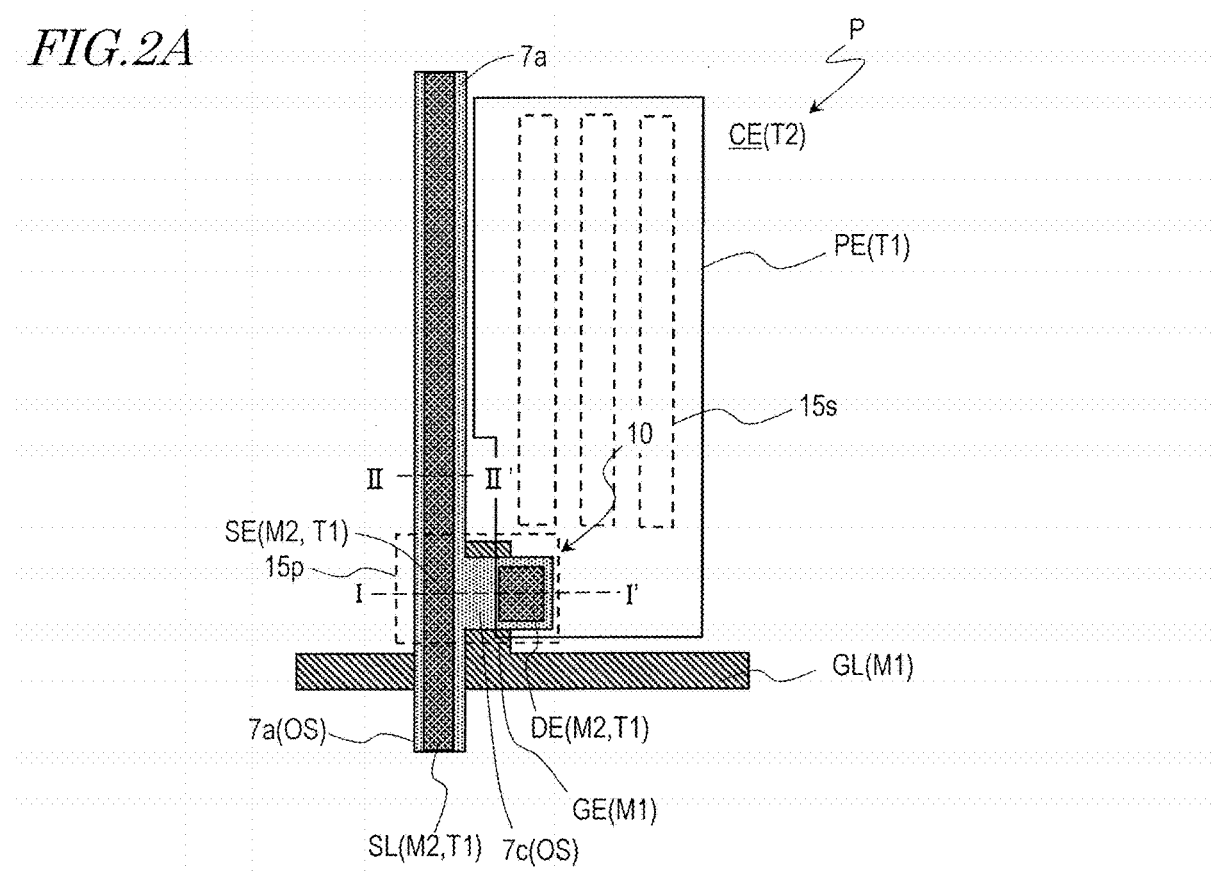
FIG. 2A A plan view illustrating an example of each pixel region P of the active matrix substrate 100 of Embodiment 1.
Figure 2B:
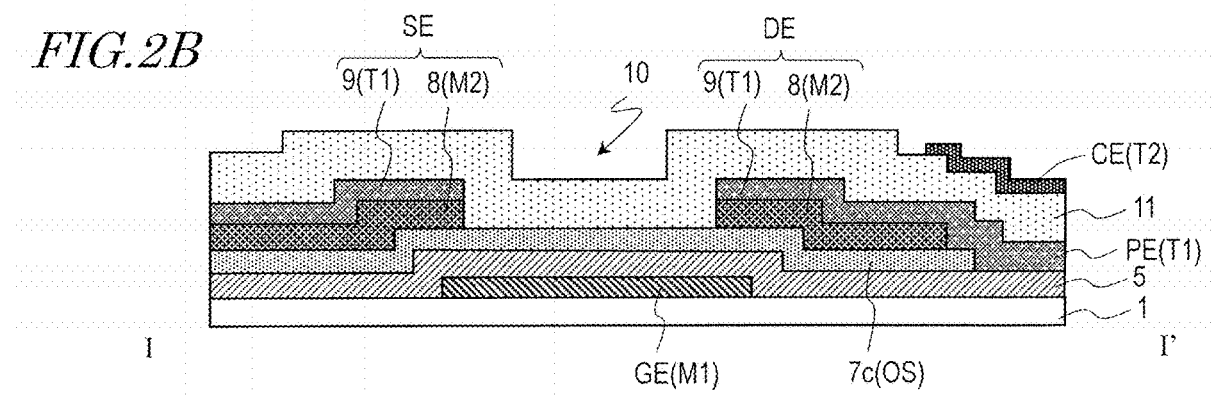
FIG. 2B A cross-sectional view of the pixel region P as taken along line I-I' in FIG. 2A.
Figure 2C:
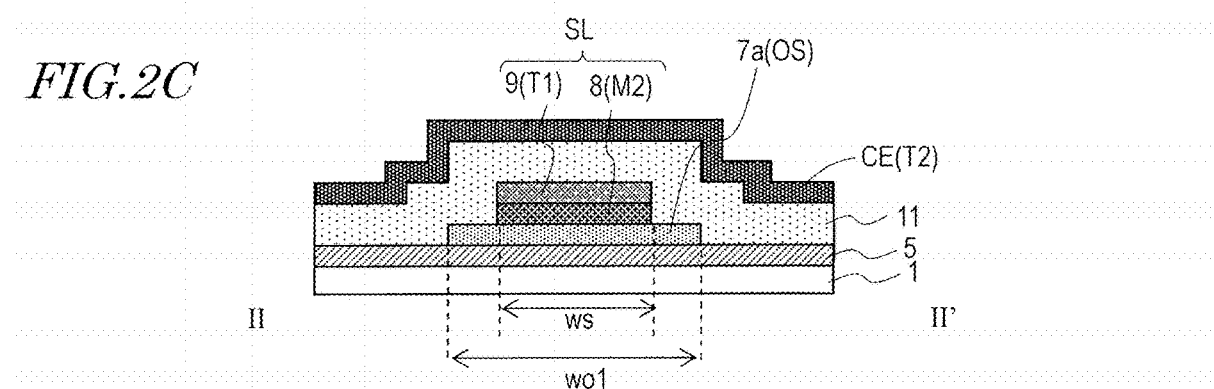
FIG. 2C A cross-sectional view of a source bus line SL as taken along line II-II' in FIG. 2A.

FIG. 2A is a plan view illustrating an example of each pixel region P of the active matrix substrate 100. FIG. 2B is a cross-sectional view of the pixel region P as taken along line I-I' across the TFT 10 in FIG. 2A. FIG. 2C is a cross-sectional view of a source bus line SL as taken along line II-II' in FIG. 2A.

The pixel region P is a region surrounded by source bus lines SL extending along the first direction and gate bus lines GL extending along a second direction which intersects the first direction, for example. The pixel region P includes a substrate 1, a TFT 10 supported on the substrate 1, a pixel electrode PE, and a common electrode CE. The common electrode CE is disposed on the pixel electrode PE via an interlevel insulating layer 11.

The TFT 10 is a bottom-gate structure TFT of the channel-etch type. The TFT 10 includes a gate electrode GE which is disposed on the substrate 1, a gate insulating layer covering the gate electrode GE, an oxide semiconductor layer 7c which is disposed on the gate electrode GE via the gate insulating layer 5, and a source electrode SE and a drain electrode DE that are electrically connected to the oxide semiconductor layer 7c. The gate electrode GE is electrically connected to a corresponding gate bus line GL, while the source electrode SE is electrically connected to a corresponding source bus line SL. The drain electrode DE is electrically connected to the pixel electrode PE.

The source electrode SE and the drain electrode DE are each disposed so as to be in contact with a portion of an upper face of the oxide semiconductor layer 7c. Within the oxide semiconductor layer 7c, a portion that is in contact with the source electrode SE is referred to as a source contact region, and a portion that is in contact with the drain electrode DE is referred to as a drain contact region. When viewed from the normal direction of the substrate 1, a region which is located between the source contact region and the drain contact region and which overlaps the gate electrode GE defines a "channel region".

The gate electrode GE and the gate bus line GL are made of a first electrically conductive film. The source bus line SL and the source electrode SE and the drain electrode DE each have a multilayer structure including a lower layer 8 that is made of a second electrically conductive film and an upper layer 9 that is made of the same transparent electrically conductive film as the pixel electrode PE (first transparent electrically conductive film). The upper layer 9 is directly in contact with an upper face of the lower layer 8. The source electrode SE and the drain electrode DE, when viewed from the normal direction of the substrate 1, may be located inside the oxide semiconductor layer 7c.

On the substrate 1 side of the plurality of source bus lines SL (i.e., between the plurality of source bus lines SL and the gate insulating layer 5), a plurality of first oxide strips 7a are disposed, the first oxide strips 7a being made of the same oxide semiconductor film as the oxide semiconductor layer 7c and extending along the first direction. Each source bus line SL is located on an upper face of one corresponding first oxide strip 7a, and is directly in contact with an upper face of that first oxide strip 7a. When viewed from the normal direction of the substrate 1, the source bus line SL does not protrude out of the corresponding first oxide strip 7a. Each source bus line SL has a width ws along the second direction (hereinafter referred to as the "line width", or simply "width") which is smaller than the width (along the second direction) wo1 of the corresponding first oxide strip 7a. In other words, when viewed from the normal direction of the substrate 1, the lower layer 8 and the upper layer 9 of the source bus line SL are located inside the upper face of the first oxide strip 7a (i.e., in between the two edges of the first oxide strip 7a that extend along the first direction).

A portion of the first oxide strip 7a that is directly in contact with the lower layer 8 (which is made of e.g. a metal film) may have its resistance decreased owing to the lower layer 8. In this case, the first oxide strip 7a includes a low resistance region (or a conductor region) having a lower electrical resistance than that of the oxide semiconductor layer 7c, which defines the active layer of the TFT 10.

The TFT 10 and the pixel electrode PE are covered by the interlevel insulating layer 11. The interlevel insulating layer 11 is an inorganic insulating layer (passivation film), for example. The interlevel insulating layer 11 is directly in contact with the channel region of the TFT 10.

On the interlevel insulating layer 11, the common electrode CE is formed. The common electrode CE is made of a second transparent electrically conductive film. The common electrode CE has one or more slits (opening(s)) 15s or recess(es) made therein, each of which corresponds to a pixel region P. Moreover, an opening 15p may be made in a region where the TFT 10 is formed (TFT formation region).

The pixel electrode PE and the common electrode CE are disposed so as to partly overlap each other via the interlevel insulating layer 11. Separate pixel electrodes PE exist for the respective pixels. The common electrode CE may not be separated for each pixel. For example, the common electrode CE may be formed across the entire pixel region P, except for the TFT formation regions.

In the present specification, a layer M1 that is made by using the first electrically conductive film (which is also referred to as an "electrically conductive film for the gate") will be referred to as a "gate metal layer"; a layer M2 that is made by using the second electrically conductive film (which is also referred to as an "electrically conductive film for the source") will be referred to as a "source metal layer"; a layer T1 that is made by using the first transparent electrically conductive film will be referred to as a "first transparent conductive layer"; and a layer T2 that is made by using the second transparent electrically conductive film will be referred to as a "second transparent conductive layer". Moreover, a layer OS that is made by using an oxide semiconductor film will be referred to as a "metal oxide layer". The metal oxide layer OS also includes any portion of the oxide semiconductor that has become electrically conductive through reduction.

From the substrate 1 side, the active matrix substrate 100 includes the gate metal layer M1, the gate insulating layer 5, the metal oxide layer OS, the source metal layer M2, the first transparent conductive layer T1, the interlevel insulating layer 11, and the second transparent conductive layer T2 in this order. FIGS. 2A through 2C depicts which constituent element is formed in which layer.

In the illustrated example, the gate electrode GE and the gate bus line GL may be integrally formed within the gate metal layer M1 (by using the first electrically conductive film). The gate electrode GE may be a part within the gate bus line GL, or be a protrusion from the gate bus line GL.

The lower layer 8 of the source electrode SE and the lower layer 8 of the source bus line SL may be integrally formed within the source metal layer M2 (by using the second electrically conductive film). The upper layer 9 of the source electrode SE and the upper layer 9 of the source bus line SL may be integrally formed within the first transparent conductive layer T1 (by using the first transparent electrically conductive film). The source electrode SE may be a part within the source bus line SL, or be a protrusion from the source bus line SL.

The first oxide strips 7a and the oxide semiconductor layer 7c are integrally formed within the metal oxide layer OS (by using an oxide semiconductor film). Note that each source electrode SE may be part of the source bus line SL, while the source contact region of each oxide semiconductor layer 7c may be part of the first oxide strip 7a.

The lower layer 8 of the drain electrode DE may be island-shaped, for example. The upper layer 9 of the drain electrode DE and the pixel electrode PE are integrally formed within the first transparent conductive layer T1 (by using the first transparent electrically conductive film). The upper layer 9 of the drain electrode DE may function as part of the pixel electrode PE.

<Source-Gate Connecting Portion Csg>

Figure 3A:
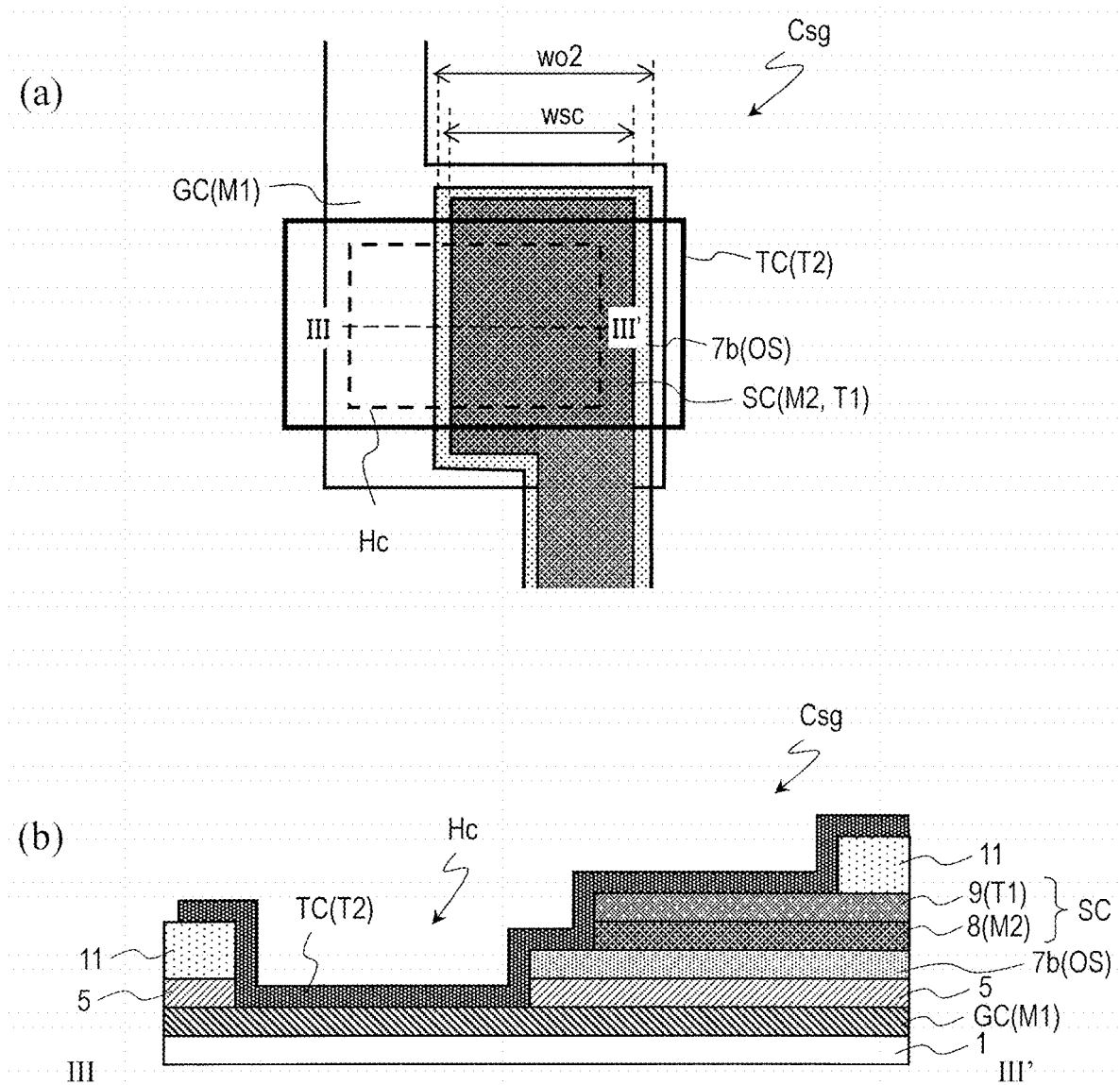
FIG. 3A A diagram illustrating an exemplary source-gate connecting portion Csg according to Embodiment 1, including portions: (a) a plan view; and (b) a cross-sectional view as taken along line III-III' in (a).

FIG. 3A, portions (a) and (b), are a plan view, and a cross-sectional view as taken along line III-III' in (a), illustrating an exemplary source-gate connecting portion Csg.

The source-gate connecting portion Csg includes a gate connecting portion GC which is formed in the gate metal layer M1, a source connecting portion SC which is formed in the source metal layer M2 and the first transparent conductive layer T1, and an upper connecting portion TC which is formed in the second transparent conductive layer T2. The gate connecting portion GC and the source connecting portion SC are electrically connected to each other via the upper connecting portion TC. The source connecting portion SC has a similar multilayer structure to that of the source bus line SL (i.e., a structure in which the lower layer 8 and the upper layer 9 are stacked in this order from the substrate 1 side). Moreover, on the substrate 1 side of the source connecting portion SC (i.e., between the source connecting portion SC and the gate insulating layer 5), a second oxide strip 7b which is made of an oxide semiconductor film is disposed.

The source connecting portion SC may be an end portion of the source bus line SL. The gate connecting portion GC may be a connection line (gate connection line) connecting between the source bus line SL and the source terminal portion Ts.

In the gate insulating layer 5 and the interlevel insulating layer 11, the source-gate connecting portion Csg has a single opening (referred to as an "SG contact hole") Hc through which at least part of the gate connecting portion GC, at least part of the second oxide strip 7b, and at least part of the source connecting portion SC are exposed. Within the SG contact hole Hc, the side faces (end faces) at the ends of the gate insulating layer 5 and the second oxide strip 7b are substantially aligned. When viewed from the normal direction of the substrate 1, within the SG contact hole Hc, the edge of the second oxide strip 7b is located inward of the edge of the source connecting portion SC (i.e., protruding into the SG contact hole Hc). Such a structure may be formed through a process described later.

The upper connecting portion TC is disposed on the interlevel insulating layer 11 and inside the SG contact hole Hc, and, within the SG contact hole Hc, is directly in contact with the gate connecting portion GC, the second oxide strip 7b, and the source connecting portion SC.

In the present embodiment, within the SG contact hole Hc, the edge of the interlevel insulating layer 11, the edge of the source connecting portion SC, and the edges of the second oxide strip 7b and the gate insulating layer 5 are located progressively inward in this order. In other words, the side face of the SG contact hole Hc that is on the source connecting portion SC side presents a staircase shape. As a result, the upper connecting portion TC is restrained from becoming disrupted.

As is illustrated in portions (a) and (b) of FIG. 3B, a first opening h1 through which the gate connecting portion GC is exposed and a second opening h2 through which the source connecting portion SC is exposed may be spaced apart from each other. On the other hand, in the example shown in portions (a) and (b) of FIG. 3A, the first opening through which the gate connecting portion GC is exposed (which is formed in the gate insulating layer 5 and the interlevel insulating layer 11) and the second opening through which the source connecting portion SC is exposed (which is formed in the interlevel insulating layer 11) partly overlap each other, thereby constituting a single SG contact hole Hc. This reduces the geometric area required for the source-gate connecting portion Csg, thereby allowing the geometric area of the peripheral region FR to be decreased (i.e., narrow-framed). As one example, the geometric area required for the source-gate connecting portion Csg can be reduced to less than ½ (e.g. 300 µm$^2$) of that in the case where two openings h1 and h2 are made in the source-gate connecting portion Csg (e.g. 700 µm$^2$).

Figure 4A:
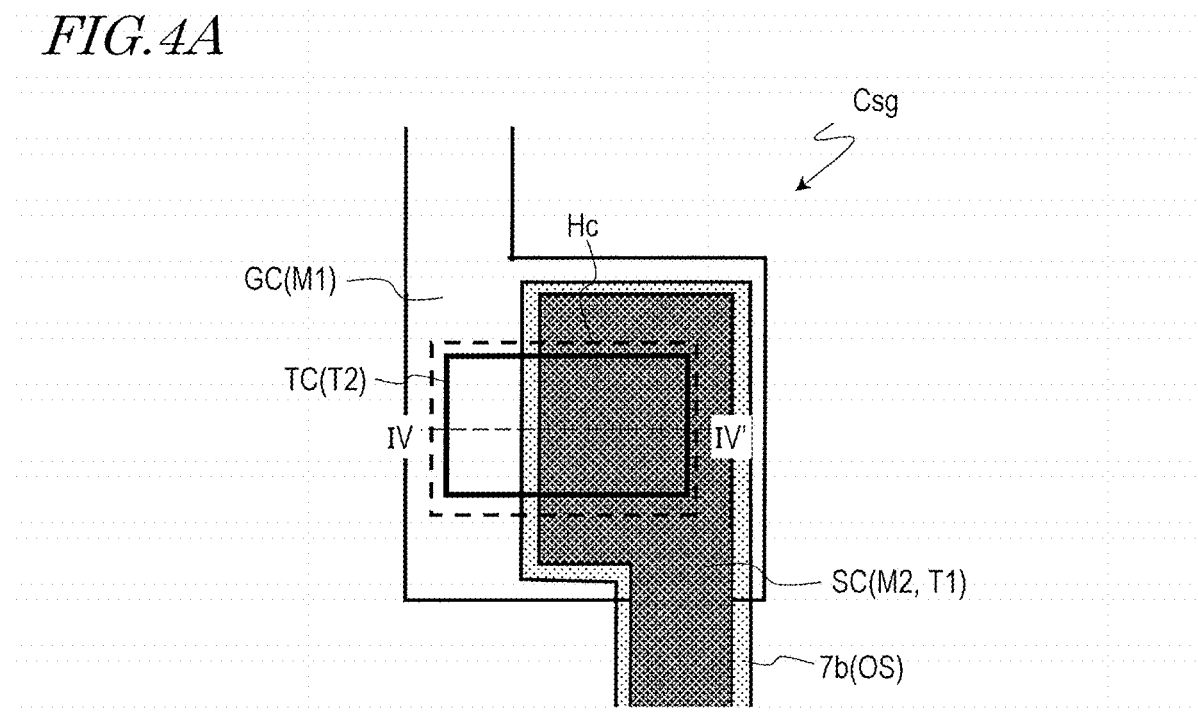
FIG. 4A A plan view illustrating another source-gate connecting portion Csg according to Embodiment 1.
Figure 4B:
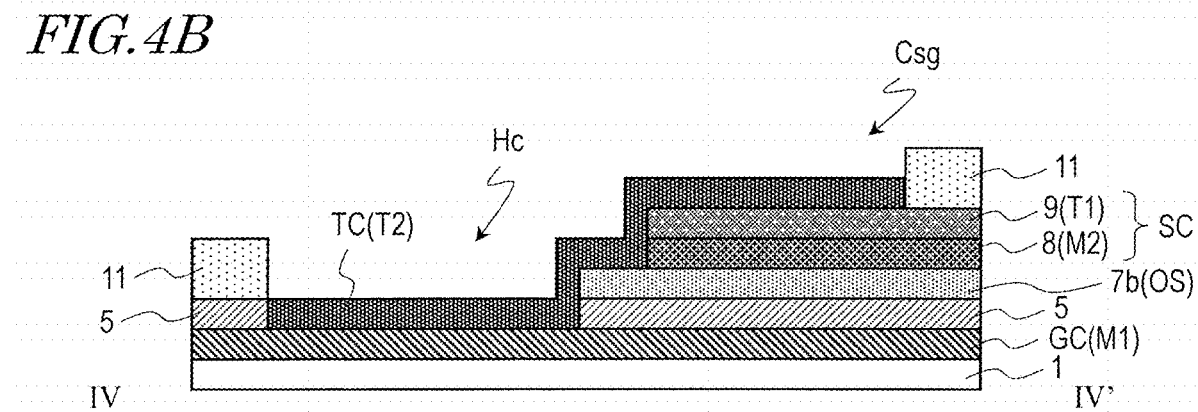
FIG. 4B A cross-sectional view showing the source-gate connecting portion Csg in FIG. 4A.

FIGS. 4A and 4B are a plan view and a cross-sectional view, respectively, illustrating another source-gate connecting portion Csg according the present embodiment.

As shown in the figure, an island-shaped upper connecting portion TC may be formed only within the SG contact hole Hc, without being in contact with the upper face of the interlevel insulating layer 11 (i.e., without riding on the interlevel insulating layer 11). As a result of this, level differences in the non-displaying region FR (particularly in a region where a sealer with which to seal the liquid crystal layer is formed (hereinafter a "sealing region")) can be reduced. Consequently, moisture can be restrained from intruding from outside of the sealer, whereby blot-like displaying defects that might otherwise occur near the peripheral edge of the displaying region can be reduced. Moreover, at the peripheral edge of the displaying region, variations in the liquid crystal cell gap (rise-and-fall unevennesses) can be restrained from occurring due to level differences in the sealing region. Furthermore, when an alignment film is subjected to rubbing, rubbing streaks (i.e., unevennesses occurring in line form in the alignment film) can be restrained from occurring due to level differences (rises and falls) in the sealing region being transferred, via the rubbing cloth, to the alignment film within the displaying region. This allows display unevennesses associated with rubbing streaks to be reduced.

<Terminal Portion T>

Figure 5A:
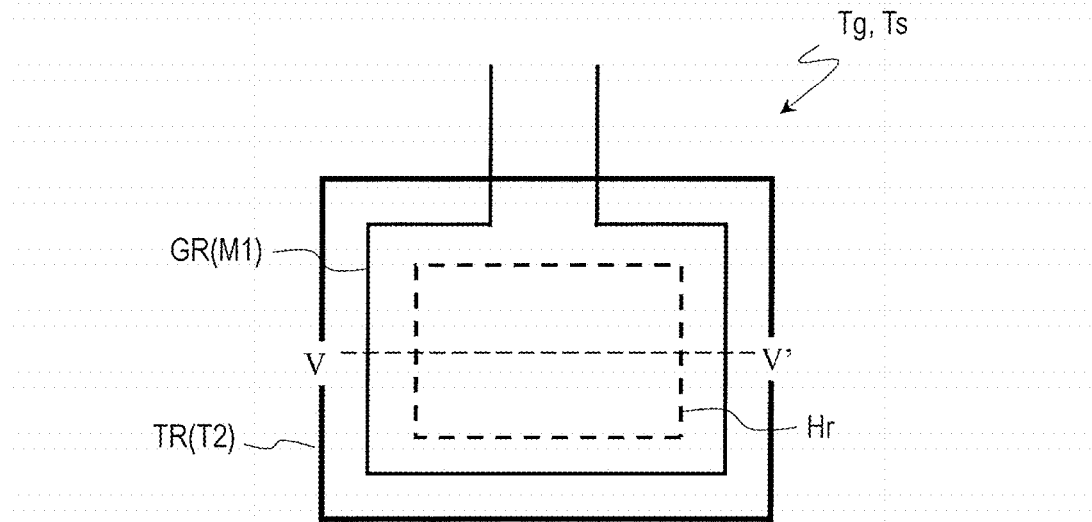
FIG. 5A A plan view illustrating a terminal portion T according to Embodiment 1.
Figure 5B:
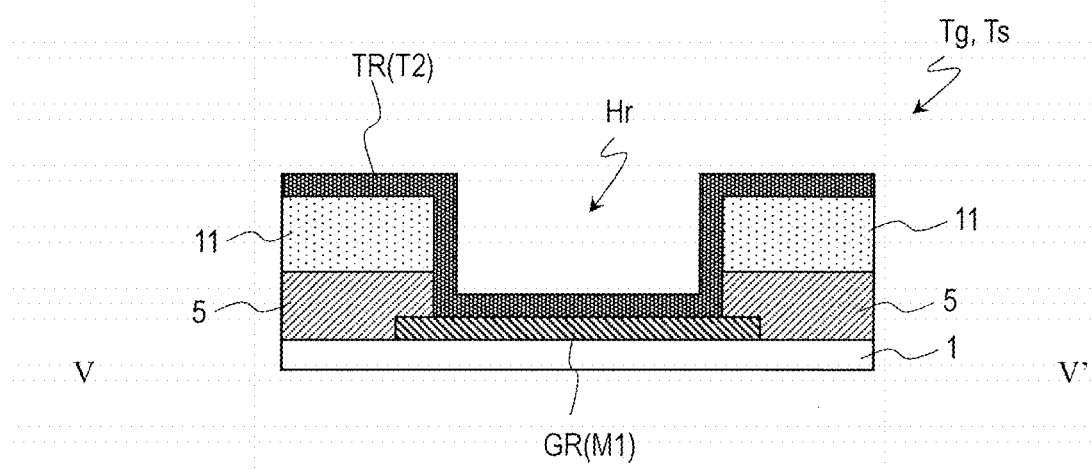
FIG. 5B A cross-sectional view showing the terminal portion T in FIG. 5A.

FIGS. 5A and 5B are a plan view and a cross-sectional view, respectively, illustrating an exemplary source terminal portion Ts and/or a gate terminal portion Tg (which are hereinafter collectively referred to as the "terminal portions T").

The terminal portion T includes a lower conductive portion GR which is formed in the gate metal layer M1, and an island-shaped upper conductive portion TR which is formed in the second transparent conductive layer T2. Within a terminal portion contact hole Hr which is formed in the gate insulating layer 5 and the interlevel insulating layer 11 so as to expose at least part of the lower conductive portion GR, the upper conductive portion TR is directly in contact with the lower conductive portion GR. In the gate terminal portion Tg, the lower conductive portion GR may be an end portion of the gate bus line GL. In the source terminal portion Ts, the lower conductive portion GR may be an end portion of the aforementioned gate connection line, for example. The gate connection line may be connected to the source bus line SL via the source-gate connecting portion Csg.

<Method of Producing the Active Matrix Substrate 100>

Next, with reference to FIGS. 6A though 6E and FIG. 7, an exemplary method of producing the active matrix substrate 100 according to the present embodiment will be described.

FIGS. 6A through 6E are step-by-step cross-sectional views for describing the exemplary method of producing the active matrix substrate 100, schematically showing: a region (gate bus line formation region) 101 in which a gate bus line GL is formed, a region (source bus line formation region) 102 in which a source bus line SL is formed; a pixel aperture region 103 to become the aperture (light-transmitting portion) of each pixel; a TFT formation region 104 in which a TFT 10 is formed; and a source-gate connecting portion formation region 105 in which a source-gate connecting portion Csg is formed. FIG. 7 shows in outline a fabrication process of the active matrix substrate 100.

(STEP 1: Formation of Gate Metal Layer M1 (FIG. 6A))

On the substrate 1, a first electrically conductive film (electrically conductive film for the gate) (thickness: e.g. not less than 50 nm and not more than 500 nm) is formed by sputtering technique, for example. Next, through a first photolithography step using a first photomask and a wet etching or dry etching step, the first electrically conductive film is patterned. As a result, as shown in FIG. 6A, a gate metal layer M1 is formed which includes: a gate bus line GL, a gate electrode GE of a TFT, a gate connecting portion GC, and a lower conductive portion (not shown).

As the substrate 1, a transparent and electrically insulative substrate, e.g., a glass substrate, a silicon substrate, a thermally resistant plastic substrate (resin substrate), or the like may be used.

There is no particular limitation as to the material of the first electrically conductive film, and a film containing any metal such as aluminum (Al), tungsten (W), molybdenum (Mo), tantalum (Ta), chromium (Cr), titanium (Ti), copper (Cu) or an alloy thereof, or a metal nitride thereof, may be used as appropriate. Moreover, a multilayer film obtained by stacking a plurality of such films may be used. Herein, as the first electrically conductive film, a multilayer film including a Ti layer (thickness: 30 nm), an Al film (thickness: 200 nm), and a TiN film (thickness: 100 nm) in this order from the substrate 1 side is used.

(STEP 2: Formation of Gate Insulating Layer 5 and Metal Oxide Layer OS, a First Patterning of Source Metal Layer M2 (FIG. 6B))

Next, on the substrate 1, a gate insulating layer 5 is formed so as to cover the gate metal layer M1.

The gate insulating layer 5 is formed by CVD technique, for example. As the gate insulating layer 5, a silicon oxide (SiOx) layer, a silicon nitride (SiNx) layer, a silicon oxide nitride (SiOxNy; x>y) layer, a silicon nitride oxide (SiNxOy; x>y) layer, or the like may be used as appropriate. The gate insulating layer 5 may be a single layer, or have a multilayer structure. For example, in order to prevent diffusion of impurities or the like from the substrate 1, a silicon nitride (SiNx) layer, a silicon nitride oxide layer, or the like may be formed on the substrate (lower layer) side, and in a layer above it (upper layer), a silicon oxide ($SiO_2$) layer, a silicon oxide nitride layer, or the like may be formed for providing electrical insulation. Herein, the gate insulating layer 5 is formed so as to have a multilayer structure in which an SiNx layer having a thickness of e.g. 300 nm defines a lower layer and an $SiO_2$ film having a thickness of e.g. 50 nm defines an upper layer.

In the case where an oxide semiconductor layer is used as the active layer of the TFT, it is preferable that the uppermost layer (i.e., a layer which is in contact with the oxide semiconductor layer) of the gate insulating layer 5 is an oxygen-containing layer (e.g., an oxide layer such as $SiO_2$). As a result, when oxygen deficiencies occur in the oxide semiconductor layer, the oxygen deficiencies can be remedied with the oxygen contained in the oxide layer, whereby oxygen deficiencies in the oxide semiconductor layer can be effectively reduced.

Thereafter, an oxide semiconductor film and a second electrically conductive film are formed in this order on the gate insulating layer 5.

The oxide semiconductor film may be formed by sputtering technique, for example. The thickness of the oxide semiconductor film may be e.g. not less than 30 nm and not more than 200 nm. Herein, as the oxide semiconductor film, an In—Ga—Zn—O based semiconductor film (thickness: 50 nm) film containing In, Ga, and Zn is formed.

The second electrically conductive film may be formed by sputtering technique, for example. There is no particular limitation as to the material of the second electrically conductive film, and a film containing any metal such as aluminum (Al), tungsten (W), molybdenum (Mo), tantalum (Ta), copper (Cu), chromium (Cr), or titanium (Ti), or an alloy thereof, or a metal nitride thereof, may be used as appropriate. Herein, as an electrode film for sources, a Ti layer (thickness: 50 nm), an Al layer (thickness: 150 nm), and a Ti layer (thickness: 50 nm) are formed in this order, thereby providing a multilayer film.

Next, the oxide semiconductor film and the second electrically conductive film are patterned. Herein, first, the second electrically conductive film is patterned through a second photolithography step using a second photomask and dry etching. Then, through wet etching with oxalic acid, the oxide semiconductor film is patterned.

Thus, as shown in FIG. 6B, in the TFT formation region 104, an electrode layer 84 to become the source/drain of the TFT is formed from the second electrically conductive film, and an oxide semiconductor layer 7c to become the active layer of the TFT is formed from the oxide semiconductor film. Patterning of the oxide semiconductor film and the second electrically conductive film is performed by using the same resist mask, and therefore side faces of the electrode layer 84 and the oxide semiconductor layer 7c are aligned. The electrode layer 84 is not separated into a source and a drain, and has the same planar shape as that of the oxide semiconductor layer 7c.

In the source bus line formation region 102, a preliminary source bus line 82 to become the lower layer of the source bus line SL is formed from the second electrically conductive film, and a first oxide strip 7a is formed from the oxide semiconductor film. Side faces of the first oxide strip 7a and the preliminary source bus line 82 are aligned. The width wo1 of the preliminary source bus line 82 and the first oxide strip 7a is greater than the desired width of the source bus line SL. For example, when the desired width of the source bus line SL is 4 μm, the width wo1 may be designed to be 7 μm.

In the source-gate connecting portion formation region 105, a preliminary source connecting portion 85 is formed from the second electrically conductive film, and a second oxide strip 7b is formed from the oxide semiconductor film. Side faces of the preliminary source connecting portion 85 and the second oxide strip 7b are aligned, and the width of the preliminary source connecting portion 85 and the second oxide strip 7b is greater than the desired width of the source connecting portion.

In the other regions (e.g., the pixel aperture region 103), the oxide semiconductor film and the second electrically conductive film are removed so as to expose the gate insulating layer 5.

Through this step, a metal oxide layer OS including the oxide semiconductor layer 7c, the first oxide strip 7a, and the second oxide strip 7b is obtained. Moreover, a source metal layer in preliminary form is obtained, including the preliminary source bus line 82, the electrode layer 84, and the like.

(STEP 3: Second Patterning of Source Metal Layer M2 and Formation of First Transparent Conductive Layer T1 (FIG. 6C))

Next, a first transparent electrically conductive film is formed so as to cover the source metal layer in preliminary form (i.e., the preliminary source bus line 82 and the electrode layer 84, etc.). As the first transparent electrically conductive film, for example, an ITO (indium tin oxide) film (thickness: 50 nm to 150 nm), an IZO film (indium zinc oxide), a ZnO film (zinc oxide film), or the like may be used. Herein, as the transparent electrically conductive film, an ITO film (thickness: 65 nm) is formed by sputtering technique.

Next, patterning of the first transparent electrically conductive film and the second electrically conductive film is performed. Herein, first, through a third photolithography step using a third photomask and wet etching, the first transparent electrically conductive film is patterned. Oxalic acid may be used as the etchant, for example. Then, through dry etching, the second electrically conductive film is patterned.

Thus, as shown in FIG. 6C, a pixel electrode PE is obtained from the first transparent electrically conductive film, and a source electrode SE and a drain electrode DE are formed from the first transparent electrically conductive film and the second electrically conductive film (source-drain separation), whereby the TFT 10 is obtained. Moreover, from the first transparent electrically conductive film and the second electrically conductive film, a source bus line SL and a source connecting portion SC are obtained.

The source bus line SL, the source electrode SE, the drain electrode DE, and the source connecting portion SC each have a multilayer structure including a lower layer 8 and an upper layer 9. Since patterning of the first transparent electrically conductive film and the second electrically conductive film is performed by using the same resist mask, side faces of the lower layer 8 and the upper layer 9 in the multilayer structure can be aligned.

Specifically, in the TFT formation region 104, the upper layer 9 of the source electrode SE and the drain electrode DE is formed from the first transparent electrically conductive film, and the lower layer 8 of the source electrode SE and the drain electrode DE is formed from the electrode layer 84. In the pixel aperture region 103, the pixel electrode PE is obtained from the first transparent electrically conductive film.

In the source bus line formation region 102, the upper layer 9 of the source bus line SL is formed from the first transparent electrically conductive film, and the lower layer 8 of the source bus line SL is formed from the preliminary source bus line 82. The width of the upper layer 9 of the source bus line SL and the lower layer 8 is smaller than the width of the first oxide strip 7a.

In the source-gate connecting portion formation region 105, the upper layer 9 of the source connecting portion SC is formed from the first transparent electrically conductive film, and the lower layer 8 of the source connecting portion SC is formed from the preliminary source connecting portion 85. The lower layer 8 and the upper layer 9 of the source connecting portion SC are disposed so as to not to protrude out of the upper face of the second oxide strip 7b. The width wsc of the lower layer 8 and the upper layer 9 of the source connecting portion SC is smaller than the width wo2 of the second oxide strip 7b. In other words, when viewed from the normal direction of the substrate 1, the lower layer 8 and the upper layer 9 of the source connecting portion SC are located inward of (the upper face of) the second oxide strip 7b.

Through this step, a source metal layer M2 including the lower layer 8 of the source bus line SL, etc., and a first transparent conductive layer T1 including the upper layer 9 of the source bus line SL, etc., and the pixel electrode PE are obtained.

(STEP 4: Formation of Interlevel Insulating Layer 11 (FIG. 6D)

Over the entire substrate 1, an interlevel insulating layer 11 is formed so as to cover the TFT 10 and the source bus line SL. As the interlevel insulating layer 11, for example, an inorganic insulating layer such as a silicon oxide (SiOx) film, a silicon nitride (SiNx) film, a silicon oxide nitride (SiOxNy; x>y) film, a silicon nitride oxide (SiNxOy; x>y) film, or the like may be formed. The inorganic insulating layer may be formed by CVD technique, for example. Although there is no particular limitation as to the thickness of the interlevel insulating layer 11, it may be e.g. not less than 300 nm and not more than 1000 nm. The interlevel insulating layer 11 may not include any planarization film such as an organic insulating layer.

In this example, as the interlevel insulating layer 11, a multilayer film in which a silicon oxide ($SiO_2$) layer 11A defines a lower layer and a silicon nitride (SiNx) layer 11B defines an upper layer is formed by CVD technique. Within the interlevel insulating layer 11, since an oxide layer such as the $SiO_2$ layer 11A is used as the lower layer which is directly in contact with the channel region of the oxide semiconductor layer 7c, oxygen deficiencies in the oxide semiconductor layer 7c can be reduced, thus allowing for stability of the characteristics of the TFT 10. Moreover, using the SiNx layer 11B as the upper layer allows pinholes to be suppressed, and allows the interlevel insulating layer 11 to become a thick film, thereby reducing leakage between the pixel electrode PE and a common electrode CE (described later) with greater certainty.

Next, through a fourth photolithography step using a fourth photomask and dry etching, the interlevel insulating layer 11 and the gate insulating layer 5 are patterned.

Thus, as shown in FIG. 6D, a single opening (SG contact hole Hc) may be created in the interlevel insulating layer 11 and the gate insulating layer 5, through which at least part of the gate connecting portion GC, at least part of the second oxide strip 7b, and at least part of the source connecting portion SC are exposed. In this case, the second oxide strip 7b, being an SG oxide semiconductor film, functions as an etchstop. Therefore, the side face of the gate insulating layer 5 and the side face of the second oxide strip 7b are aligned at the side face of the SG contact hole Hc.

Although not shown, an opening (terminal portion contact hole) Hr through which part of the gate bus line GL or the gate connection line is exposed is created also in the terminal portion formation region (see FIGS. 5A and 5B).

In this patterning step, preferably, the side faces of the contact holes Hc and Hr are forward tapered, and the etching conditions such as etching time are adjusted so as to reduce overetching of the electrodes and wiring lines to be exposed (i.e., so that the surface layer of the electrodes and wiring lines will not become a thin film (i.e., have a reduced film thickness) through etching).

(STEP 5: Formation of Second Transparent Conductive Layer T2 (FIG. 6E))

Next, on the interlevel insulating layer 11 and inside the SG contact hole Hc, a second transparent electrically conductive film is formed. The material and thickness of the second transparent electrically conductive film may be similar to those of the first transparent electrically conductive film. Herein, an ITO film (thickness: 65 nm) is formed by sputtering technique.

Thereafter, the second transparent electrically conductive film is patterned. Thus, as shown in FIG. 6E, a common electrode CE covering substantially the entire displaying region (except for the TFT formation region 104) is formed, and also an upper connecting portion TC is formed in the source-gate connecting portion formation region 105. In the TFT formation region 104, the common electrode CE has one or more slits. Within the SG contact hole Hc, the upper connecting portion TC is directly in contact with the source connecting portion SC, the second oxide strip 7b, and the gate connecting portion GC. Although not shown, also in the terminal portion formation region, an upper conductive portion TR which is directly in contact with the lower conductive portion GR is created within the terminal portion contact hole Hr.

In this step, a second transparent conductive layer T2 including the common electrode CE and the upper connecting portion TC is obtained. In this manner, the active matrix substrate 100 is produced.

Note that, at STEP 4, instead of creating a single SG contact hole Hc in the source-gate connecting portion formation region 105, a first opening h1 through which to expose part of the gate electrode GE may be created in the gate insulating layer 5 and in the interlevel insulating layer 11, and a second opening h2 through which to expose part of the pixel electrode PE may be created in the interlevel insulating layer 11 (see FIG. 3B). In this case, at STEP 5, an upper connecting portion TC is formed which is directly in contact with the gate connecting portion GC within the first opening h1 and which is directly in contact with the source connecting portion SC within the second opening h2.

With the method of producing the active matrix substrate 100 according to the present embodiment, the number of photomasks used can be made much smaller than conventional, and also the production cost and the number of production steps can be reduced. For example, eight photomasks would conventionally have been needed to produce an active matrix substrate having oxide semiconductor TFTs (see Patent Document 1); on the other hand, the method described above enables production with five photomasks. Thus, an enhanced producibility can be obtained.

Moreover, in the method described above, the source bus line SL has a multilayer structure including the lower layer 8 in the source metal layer M2 and the upper layer 9 in the first transparent conductive layer T1 (redundant structure). As a result, during the fabrication process, even if a disrupted portion emerges in the lower layer 8 of the source bus line SL due to patterning failures in the source metal layer M2 associated with dust or foreign objects, such a disrupted portion in the lower layer 8 can be remedied by the upper layer 9; thus, disruptions in the source bus line SL can be reduced. According to a study by the inventors, by adopting a redundant structure for the source bus line SL, the percent defective associated with disruptions in the source bus line SL can be reduced to ⅓ or less of that in the case of not introducing a redundant structure.

Furthermore, in the method described above, patterning of the source metal layer M2 is performed in two steps. Specifically, in the second photolithography step, the oxide semiconductor film is patterned while a first patterning of the second electrically conductive film is carried out; and in the third photolithography step, a second patterning of the second electrically conductive film is carried out while the first transparent electrically conductive film is patterned. By performing such two steps of patterning, the first oxide strip 7a is formed under the source bus line SL so as to have a line width which is greater than that of the source bus line SL. This provides for an improved coverage of the interlevel insulating layer with respect to the source bus line SL. Moreover, regarding the source-gate connecting portion Csg, the edge of the second oxide strip 7b is located inward of the edge of the source connecting portion SC within the SG contact hole Hc, whereby coverage of the upper connecting portion TC can be improved, and disruption of the upper connecting portion TC can be suppressed. Thus, the production yield can be improved.

In the case where an amorphous silicon semiconductor layer is used as the active layer of the TFT, during a patterning step of the interlevel insulating layer 11 (STEP 4), when the interlevel insulating layer 11 is dry etched, there is a possibility that the amorphous silicon semiconductor layer may also be etched ("side etching"), so that the side face of the amorphous silicon semiconductor layer may recede from the side face of the source connecting portion SC (thus resulting in a reverse tapered shape). If the side face of the opening becomes reverse tapered, coverage of the upper connecting portion TC will be greatly reduced. On the other hand, the second oxide strip 7b is highly immune to dry etching, and thus the second oxide strip 7b is unlikely to be etched during the etching step of the interlevel insulating layer 11. Therefore, according to the present embodiment, without increasing the number of photomasks, the side face of the SG contact hole Hc can be made to have a staircase-like forward tapered shape, whereby coverage of the upper connecting portion TC can be improved.

Furthermore, in the case where an amorphous silicon semiconductor layer is used, presence of the amorphous silicon semiconductor layer under the source bus line may permit photo excitation of the amorphous silicon semiconductor as caused by light from a backlight (PWM dimming), such that the amorphous silicon semiconductor may become electrically conductive. This will alter the capacitance between the source metal layer M2 and the second transparent conductive layer T2, thus causing a problem in that the panel driving frequency may interfere with the PWM frequency, resulting in noises (beat noise) on the screen within a specific frequency band. In the present embodiment, the oxide semiconductor layer 7c is used which is less susceptible to light than is an amorphous silicon semiconductor, and also a silicon oxide layer with a low insulating constant is used for the interlevel insulating layer 11, changes in capacitance can be reduced, and occurrences of beat noise can be suppressed.

<Variant 1>

An active matrix substrate according to Variant 1 differs from the active matrix substrate 100 in that, in the displaying region, the source bus line SL is a transparent wiring line which only includes the upper layer 9 (i.e., not including the lower layer 8).

FIGS. 8A through 8E are step-by-step cross-sectional views for describing a method of producing an active matrix substrate 200 according to Variant 1. In FIGS. 8A through 8E, constituent elements similar to those in FIGS. 6A through 6E are denoted with like reference numerals. Hereinafter, differences from the steps which have been illustrated with reference to FIGS. 6A through 6E will mainly be described.

First, as shown in FIG. 8A, a gate metal layer M1 is formed.

Next, as shown in FIG. 8B, an oxide semiconductor film and a second electrically conductive film are formed, and patterned. In Variant 1, there is a difference from the step shown in FIG. 6B in that, in the source bus line formation region 102 within the displaying region, the oxide semiconductor film and the second electrically conductive film are removed.

Next, as shown in FIG. 8C, a first transparent electrically conductive film is formed, and the first transparent electrically conductive film and the second electrically conductive film are patterned. As a result, the lower layer 8 of the source electrode SE, the lower layer 8 of the drain electrode DE, and the lower layer 8 of the source connecting portion SC are formed from the second electrically conductive film, whereas the source bus line SL, the pixel electrode PE, the upper layer 9 of the source electrode SE, the upper layer 9 of the drain electrode DE, and the upper layer 9 of the source connecting portion SC are formed from the first transparent electrically conductive film. In the displaying region, the source bus line SL is a transparent wiring line which only includes the first transparent electrically conductive film. Since the first oxide strip 7a is not disposed on the substrate 1 side of the transparent wiring line, the transparent wiring line is in contact with the upper face of the gate insulating layer 5.

Thereafter, as shown in FIG. 8D and FIG. 8E, the interlevel insulating layer 11 and the second transparent conductive layer T2 are formed. In this manner, the active matrix substrate 200 is produced.

According to Variant 1, since the transparent source bus line SL is formed in the displaying region, the pixel aperture ratio can be enhanced. Moreover, since no oxide semiconductor is disposed under the source bus line SL, the aforementioned beat noise can be reduced more effectively.

As shown in FIGS. 8A through 8E, in the non-displaying region (e.g., the source-gate connecting portion formation region), the source bus line SL may have a multilayer structure including a lower layer 8 which is made of the second electrically conductive film and an upper layer 9 which is made of the first transparent electrically conductive film. As a result, while reducing the circuit resistance, the pixel aperture ratio can be enhanced. Alternatively the entire source bus line SL (including any portion located in the non-displaying region) may have a single-layer structure which is made of the first transparent electrically conductive film alone.

<Variant 2>

Variant 2 differs from the active matrix substrate 100 in that, in the displaying region, a portion of the source bus line SL has a single-layer structure while the other portion of the source bus line SL has a multilayer structure.

Figure 9A:
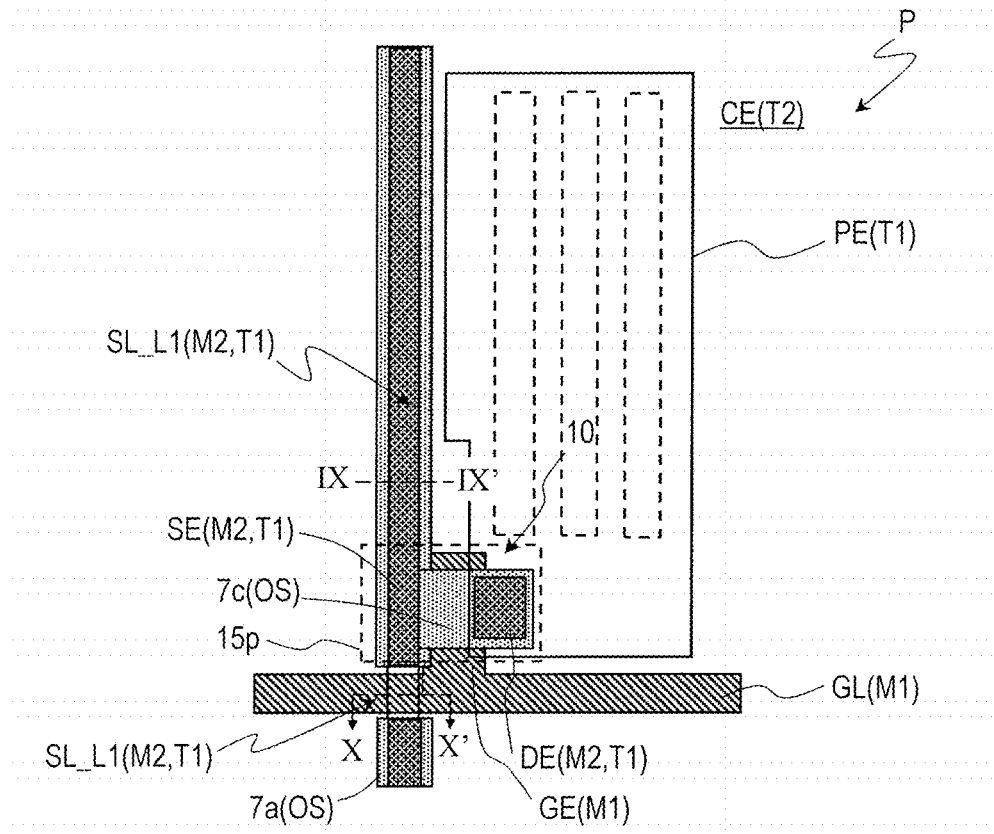
FIG. 9A A plan view showing a source bus line SL according to Variant 2.
Figure 9B:
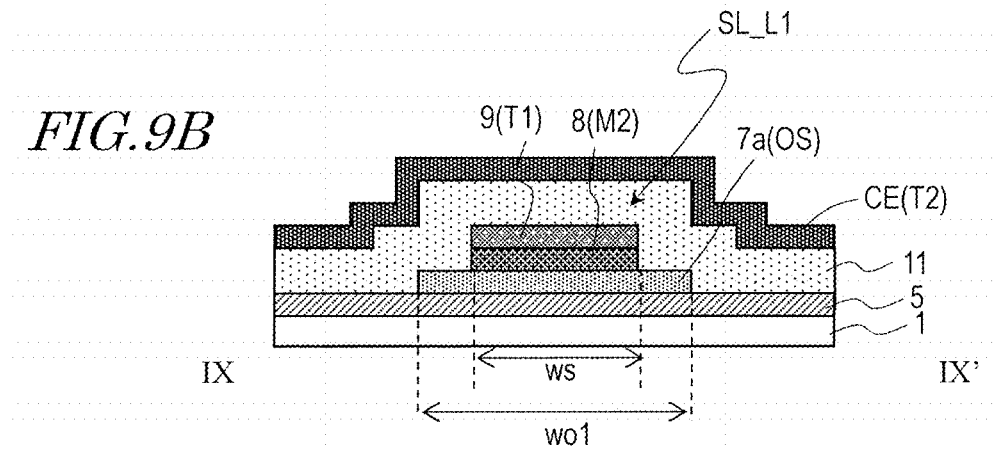
FIG. 9B A cross-sectional view of the source bus line SL according to Variant 2 as taken along line IX-IX' in FIG. 9A.
Figure 9C:
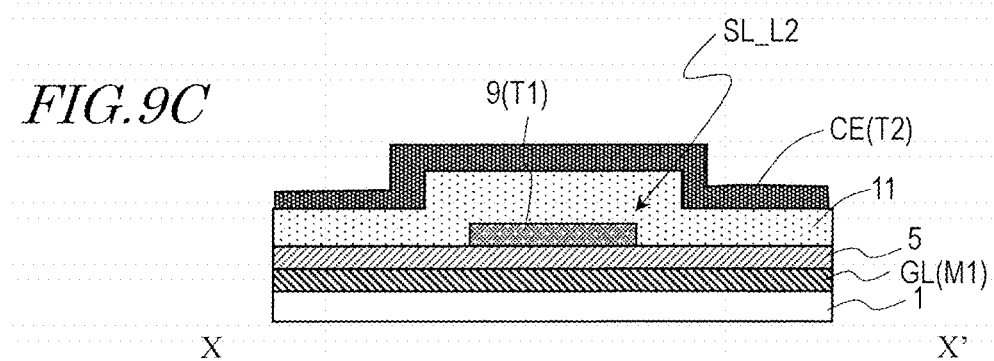
FIG. 9C A cross-sectional view of the source bus line SL according to Variant 2 as taken along line X-X' in FIG. 9A.

FIG. 9A is a plan view of the source bus line SL according to Variant 2, and FIGS. 9B and 9C are cross-sectional views of the source bus line SL as taken along line XI-XI' and line X-X', respectively.

The source bus line SL includes: a first source portion L1_SL having a multilayer structure including a lower layer 8 and an upper layer 9; and a second source portion L2_SL including an upper layer 9 but not including a lower layer 8. The second source portion L2_SL has a single-layer structure which only includes an upper layer 9, for example, and is transparent.

The first source portion L1_SL is located above the first oxide strip 7a. On the other hand, the first oxide strip 7a is not disposed on the substrate 1 side of the second source portion L2_SL. The second source portion L2_SL is in contact with an upper face of the gate insulating layer 5, for example.

In this example, the second source portion L2_SL is to be disposed in each intersecting region where the source bus line SL and the gate bus line GL intersect when viewed from the normal direction of the substrate 1, whereas the first source portion L1_SL is to be disposed in any other region of the displaying region (i.e., a region that is located between two adjoining gate bus lines GL) than the intersecting region. Any portion of the source bus line SL that is located in the non-displaying region may be the first source portion L1_SL having a multilayer structure.

In this variant, it suffices so long as the source bus line SL includes the first source portion L1_SL and the second source portion L2_SL, and their placement is not limited to the illustrated example. However, disposing the second source portion L2_SL in the intersecting region between the source bus line SL and the gate bus line GL provides an advantage in that level differences to occur in the intersecting region can be reduced.

The active matrix substrate of Variant 2 is formed through steps which have been described with reference to FIGS. 6A through 6E. However, at STEP 2, in the subregion of the source bus line formation region 102 where the second source portion L2_SL is to be formed, the oxide semiconductor film and the second electrically conductive film are removed (see FIG. 8B depicting Variant 1); and, in the subregion where the first source portion L1_SL is to be formed, the first oxide strip 7a and the lower layer 8 are formed from the oxide semiconductor film and the second electrically conductive film. Thus, the resultant source bus line SL partly has a single-layer structure.

<Variant 3>

An active matrix substrate of Variant 3 differs from the active matrix substrate 100 in that an upper layer 9 of the source bus line SL is disposed so as to cover the upper face and the side face of a lower layer 8.

FIGS. 10A through 10E are step-by-step cross-sectional views for describing a method of producing the active matrix substrate 300 according to Variant 3. In FIGS. 10A through 10E, constituent elements similar to those in FIGS. 6A through 6E are denoted with like reference numerals. Hereinafter, differences from the steps which have been illustrated with reference to FIGS. 6A through 6E will mainly be described.

As shown in FIG. 10A, a gate metal layer M1 is formed.

Next, as shown in FIG. 10B, an oxide semiconductor film and a second electrically conductive film are formed, and patterned.

According to Variant 3, in the source bus line formation region 102, the first oxide strip 7a and the lower layer 8 of the source bus line SL are formed. There is a difference from the step shown in FIG. 6B in that the width wa of the first oxide strip 7a and the lower layer 8 is smaller than the width of the finally-obtained source bus line.

Similarly, in the source-gate connecting portion formation region 105, the second oxide strip 7b and a lower layer 8 of the source connecting portion SC are formed. The width of the second oxide strip 7b and the source connecting portion SC is smaller than the width of the finally-obtained source connecting portion SC.

Next, as shown in FIG. 10C, a first transparent electrically conductive film is formed, and the first transparent electrically conductive film and the second electrically conductive film are patterned.

In the source bus line formation region 102, the upper layer 9 of the source bus line SL is formed from the first transparent electrically conductive film. There is a difference from the step shown in FIG. 6B in that the upper layer 9 is formed so as to cover the upper face and the side face of the lower layer 8 of the source bus line SL and the side face of the first oxide strip 7a. The width wb of the upper layer 9 will be greater than the width wa of the lower layer 8 and the first oxide strip 7a. Thus, the source bus line SL, including the upper layer 9 and the lower layer 8, is obtained.

Similarly, in the source-gate connecting portion formation region 105, an upper layer 9 of the source connecting portion SC is formed from the first transparent electrically conductive film. The upper layer 9 is formed so as to cover the upper face and the side face of the lower layer 8 of the source connecting portion SC and the side face of the second oxide strip 7b. The width of the upper layer 9 is greater than the width of the lower layer 8 and the second oxide strip 7b.

Thus, the source connecting portion SC, including the upper layer 9 and the lower layer 8, is obtained.

Thereafter, as shown in FIG. 10D and FIG. 10E, the interlevel insulating layer 11 and the second transparent conductive layer T2 are formed.

In Variant 3, too, the source bus line SL is formed with a redundant structure. Based on the construction of Variant 3, while reducing the increase in the electrical resistance of the source bus line SL, the width wa of the lower layer 8 can be made smaller than conventional. As a result, the pixel aperture ratio can be further increased.

Embodiment 2

An active matrix substrate according to Embodiment 2 is an active matrix substrate to be used in a liquid crystal display device based on the vertical field driving method, e.g., the VA mode. In a liquid crystal display device based on the vertical field driving method, usually, the pixel electrodes PE are formed on the active matrix substrate, while the common electrode CE is formed on the counter substrate side.

A liquid crystal display device of the VA mode is disclosed in Japanese Laid-Open Patent Publication No. 2004-078157, for example. For reference, the entire disclosure of Japanese Laid-Open Patent Publication No. 2004-078157 is incorporated herein by reference.

Figure 11A:
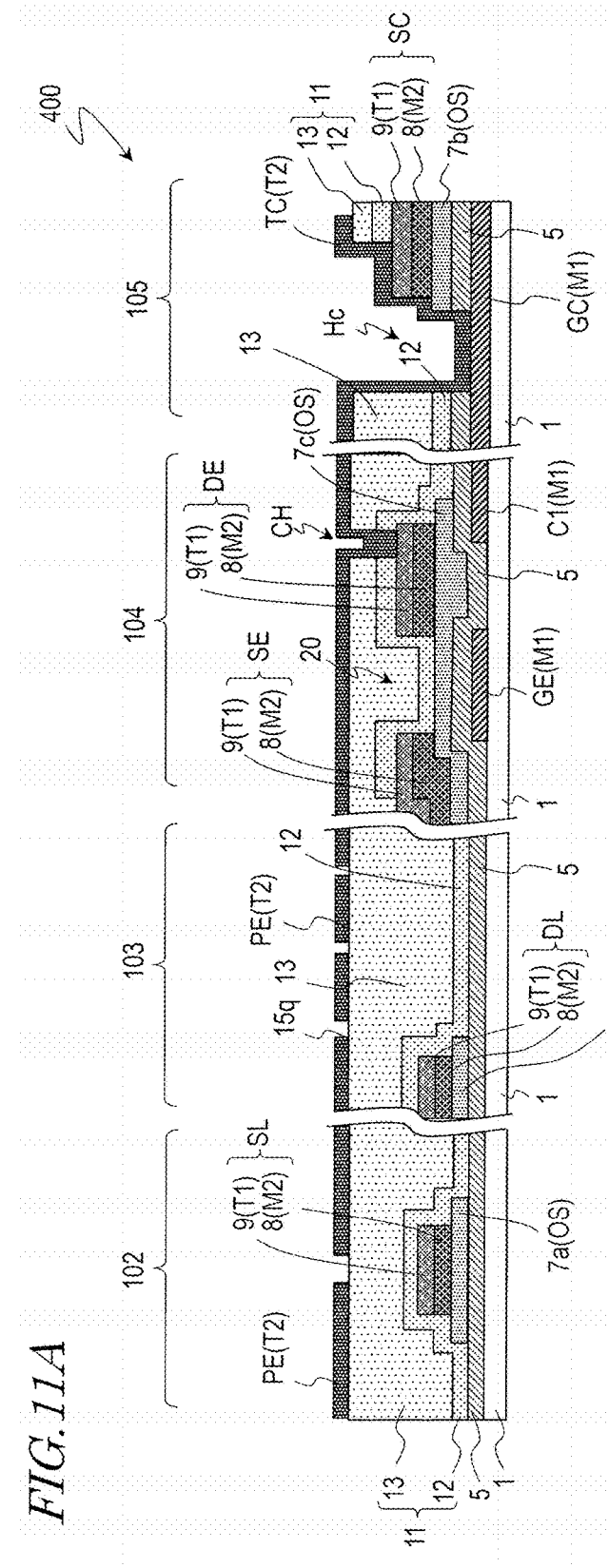
FIG. 11A A cross-sectional view illustrating an exemplary active matrix substrate 400 according to Embodiment 2.

FIG. 11A is a cross-sectional view illustrating examples of respective regions of an active matrix substrate 400 according to the present embodiment. In FIG. 11A, a source bus line formation region 102, a pixel aperture region 103, a TFT formation region 104, and a source-gate connecting portion formation region 105 are illustrated, each in its cross-sectional structure. Hereinafter, differences from Embodiment 1 will mainly be described, while conveniently omitting descriptions of similar constituent elements.

A pixel region P includes, a substrate 1, a TFT 20 supported on the substrate 1, a lower storage capacitor electrode C1, and a pixel electrode PE. The lower storage capacitor electrode C1 is formed in a gate metal layer M1. The position, shape, size, etc., of the lower storage capacitor electrode C1 may be appropriately chosen.

The TFT 20 is a channel-etch type TFT which is similar in structure to the TFT 10. A source electrode SE and a drain electrode DE of the TFT 20 have a multilayer structure including a lower layer 8 which is formed in a source metal layer M2, and an upper layer 9 which is formed in a first transparent conductive layer T1.

The TFT 20 is covered by an interlevel insulating layer 11. The interlevel insulating layer 11 includes, for example, an inorganic insulating layer (passivation film) 12 and an organic insulating layer 13 that is disposed on the inorganic insulating layer 12.

The pixel electrode PE is disposed within an aperture (referred to as a "pixel aperture" or a "pixel contact hole") CH which is formed in the interlevel insulating layer 11 and the interlevel insulating layer 11, and is in contact with the drain electrode DE within the pixel contact hole CH. Separate pixel electrodes PE exist for the respective pixel regions P. In the pixel electrode PE, one or more slits 15q for pixel division may be provided for each pixel region P.

In the pixel aperture region 103, an extension (drain extension) DL of the drain electrode DE may be provided. The drain extension DL has a multilayer structure similar to that of the drain electrode DE. On the substrate 1 side of the drain extension DL, a third oxide strip 7d, which is greater in width than the drain extension DL, is disposed. The third oxide strip 7d may be connected (i.e., integrally formed) with the oxide semiconductor layer 7c. The drain extension DL is provided in order to allow a storage capacitor electrode (not shown) which is formed in the source metal layer M2 to be connected with the drain electrode DE.

Figure 11C:
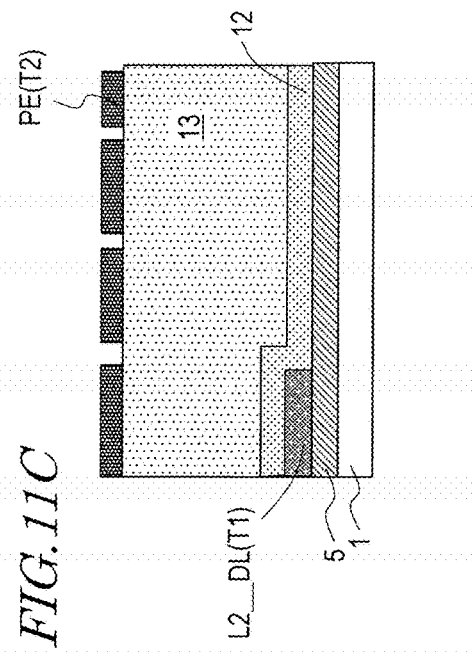
FIG. 11C A cross-sectional view illustrating another drain extension according to Embodiment 2.

As illustrated in FIG. 11C, the drain extension DL may include: a first drain portion L1_DL having a multilayer structure including a lower layer 8 and an upper layer 9; and a transparent second drain portion L2_DL which only includes an upper layer 9. In this case, the third oxide strip 7d is disposed between the first drain portion L1_DL and the gate insulating layer 5, but not disposed on the substrate 1 side of the second drain portion L2_DL. Similarly, the drain electrode DE may include a first drain portion L1_DE and a second drain portion L2_DE, such that the first drain portion L1_DE is located closer to the channel region of the TFT 20 than is the second drain portion L2_DE. For example, within the contact hole CH, the pixel electrode PE may be in contact with a transparent second drain portion L2_DE (i.e., only a transparent upper layer 9). By providing the transparent second drain portion(s) L2_DL and/or L2_DE in part of the drain extension DL and/or the drain electrode DE, the pixel aperture ratio can be improved.

The gate bus line GL (not shown), the source bus line SL, and the source-gate connecting portion Csg are similar in construction to those of the active matrix substrate 100, and the description thereof is omitted. Also in the present embodiment, at the source-gate connecting portion Csg, as illustrated in FIG. 11B, the upper connecting portion TC may be disposed only within the SG contact hole Hc, without riding on the interlevel insulating layer 11.

Figure 11B:
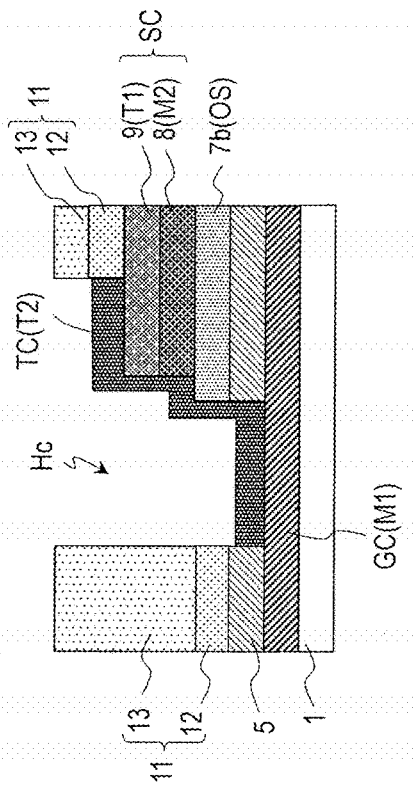
FIG. 11B A cross-sectional view illustrating another source-gate connecting portion according to Embodiment 2.

The structure of the present embodiment is not limited to the structure shown in FIGS. 11A through 11C. For example, as in Variants 1 and 2 of Embodiment 1, the source bus line SL may include a first source portion having a multilayer structure and a second source portion having a single-layer structure which is made of the first transparent electrically conductive film alone. Moreover, as in Variant 3, the upper layer 9 of the source bus line SL may cover the side face of the first oxide strip 7a and the upper face and the side face of the lower layer 8.

<Method of Producing the Active Matrix Substrate 400>

Next, with reference to FIGS. 12A through 12E and FIG. 13, an exemplary method of producing an active matrix substrate 400 according to the present embodiment will be described. Hereinafter, any description directed to similar aspects to those of Embodiment 1 (material, thickness, formation method, processing method, etc., of each layer) will be conveniently omitted.

FIGS. 12A through 12E are step-by-step cross-sectional views for describing the exemplary method of producing the active matrix substrate 400, showing a source bus line formation region 102, a pixel aperture region 103, a TFT formation region 104, and a source-gate connecting portion formation region 105. FIG. 13 shows an outline of the fabrication process of the active matrix substrate 400.

(STEP 1: Formation of Gate Metal Layer M1 (FIG. 12A))

By a method similar to that of Embodiment 1 (FIG. 6A), a first electrically conductive film is formed on a substrate 1, and the first electrically conductive film is patterned through a first photolithography step using a first photomask. As a result, a gate metal layer M1 is formed which includes: a gate electrode GE of a TFT, a gate connecting portion GC, a lower storage capacitor electrode C1, a lower conductive portion (not shown) of a terminal portion, and a gate bus line GL.

(STEP 2: Formation of Gate Insulating Layer 5 and Metal Oxide Layer OS, First Patterning of Source Metal Layer M2 (FIG. 12B))

Next, a gate insulating layer 5 is formed so as to cover the gate metal layer M1. Thereafter, an oxide semiconductor film and a second electrically conductive film are formed in this order on the gate insulating layer 5. Then, similarly to Embodiment 1 (FIG. 6B), through a second photolithography step using a second photomask, a source metal layer in preliminary form (including a preliminary source bus line 82, a preliminary drain extension 83, an electrode layer 84, and the like) and a metal oxide layer OS (including an oxide semiconductor layer 7c, a first oxide strip 7a, a second oxide strip 7b, and a third oxide strip 7d) are obtained.

STEP 3: Second Patterning of Source Metal Layer M2 and Formation of First Transparent Conductive Layer T1 (FIG. 12C))

Next, a first transparent electrically conductive film is formed so as to cover the source metal layer in preliminary form (i.e., the preliminary source bus line 82, the electrode layer 84, etc.). Then, through a third photolithography step using a third photomask, the first transparent electrically conductive film and the second electrically conductive film are patterned. Thus, as shown in FIG. 12C, the source electrode SE and the drain electrode DE are formed (source-drain separation), whereby a TFT 20 is provided. Moreover, a source bus line SL, a drain extension DL, and a source connecting portion SC are formed. Differences from STEP 3 of Embodiment 1 are that the pixel electrode is not formed in the first transparent conductive layer T1, and that the drain extension DL is formed.

The source bus line SL, the source electrode SE, the drain electrode DE, the drain extension DL, and the source connecting portion SC have a multilayer structure including a lower layer 8 and an upper layer 9. The width of the drain extension DL is smaller than the width of the third oxide strip 7d.

Through this step, a source metal layer M2 including a lower layer 8 (e.g., the source bus lines SL) and a first transparent conductive layer T1 including an upper layer 9 (e.g., the source bus lines SL) are obtained.

STEP 4: Step of Forming Interlevel Insulating Layer 11 (FIG. 12D)

An interlevel insulating layer 11 is formed over the entire substrate 1, so as to cover the TFT 10 and the source bus line SL. Herein, the interlevel insulating layer 11 has a multilayer structure including an inorganic insulating layer 12 and an organic insulating layer 13 which is disposed on the inorganic insulating layer 12. As the inorganic insulating layer 12, for example, an inorganic insulating layer such as a silicon oxide (SiOx) film, a silicon nitride (SiNx) film, a silicon oxide nitride (SiOxNy; x>y) film, a silicon nitride oxide (SiNxOy; x>y) film, or the like may be formed. The inorganic insulating layer 12 is formed by CVD technique, for example. The organic insulating layer 13 may be a film of positive-type photosensitive resin having a thickness of 2000 nm, for example. The organic insulating layer 13 may be formed through application, for example.

Next, after the organic insulating layer 13 is patterned through a fourth photolithography step using a fourth photomask, the inorganic insulating layer 12 and the gate insulating layer 5 are etched by using the organic insulating layer 13 as an etching mask. Thus, as shown in FIG. 12D, in the TFT formation region 104, a pixel contact hole CH through which to expose part of the drain electrode DE is created in the interlevel insulating layer 11, and an SG contact hole Hc through which to expose part of the gate connecting portion GC and part of the source connecting portion SC is created in the source-gate connecting portion formation region 105. In this case, the second oxide strip 7b, being an oxide semiconductor film, functions as an etchstop; therefore, the side face of the gate insulating layer 5 and the side face of the second oxide strip 7b are aligned at the side face of the SG contact hole Hc.

STEP 5: Formation of the Second Transparent Conductive Layer T2 (FIG. 12E)

Next, a second transparent electrically conductive film is formed on the interlevel insulating layer 11 and within pixel contact hole CH and the SG contact hole Hc. Thereafter, through a fifth photolithography step using a fifth photomask and wet etching, the second transparent electrically conductive film is patterned. As a result, a pixel electrode PE is formed in each pixel region P, and an upper connecting portion TC is formed in the source-gate connecting portion formation region 105. A slit(s) 15q for pixel division may be provided for each pixel electrode PE. Thus, the active matrix substrate 400 is produced.

Without being limited to the aforementioned FFS mode or VA mode, an active matrix substrate according to the present invention is applicable to display devices of various display modes. For example, it is also applicable to a TBA (Transverse Bend Alignment) mode. The TBA mode is a display method where, using a positive-type liquid crystal as the liquid crystal material, the liquid crystal is driven with a lateral field by using a pair of electrodes that are provided on an active matrix substrate, thereby defining alignment direction of the liquid crystal molecules. In the absence of an applied voltage, the liquid crystal takes a vertical alignment; under an applied voltage, the liquid crystal takes a "bend" liquid crystal orientation instead of rotating within the plane. An active matrix substrate similar to that of Embodiment 1 can be used in applications to the TBA mode. However, vertical alignment films are used as the alignment films. The TBA mode is disclosed in International Publication No. 2011/040080 and the like, for example. Moreover, Japanese Laid-Open Patent Publication No. 2015-148638, for example, discloses a type of TBA mode in which an electrode is formed also on the counter substrate, thus to utilize both a vertical field and a lateral field. The entire disclosure of Japanese Laid-Open Patent Publication No. 2015-148638 and International Publication No. 2011/040080 is incorporated herein by reference.

Furthermore, although liquid crystal display devices were illustrated as examples in the above description, active matrix substrates according to the embodiments may also be used in other display devices, such as organic electroluminescence (EL) display devices, inorganic electroluminescence display devices, MEMS display devices, and so on. The display device may include an active matrix substrate, a counter substrate opposed to the active matrix substrate, and a display medium layer provided between the active matrix substrate and the counter substrate. The display medium layer may be a liquid crystal layer, an organic EL layer, or the like.

<Regarding the Oxide Semiconductor>

The oxide semiconductor that is contained in the oxide semiconductor layer 7c may be an amorphous oxide semiconductor film, or a crystalline oxide semiconductor having a crystalline portion(s). Examples of crystalline oxide semiconductors may include polycrystalline oxide semiconductors, microcrystalline oxide semiconductors, and crystalline oxide semiconductors whose c axis is oriented substantially perpendicular to the layer plane.

The oxide semiconductor layer 7c may have a multilayer structure of two or more layers. When the oxide semiconductor layer 7c has a multilayer structure, the oxide semiconductor layer 7c may include an amorphous oxide semiconductor layer and a crystalline oxide semiconductor layer. Alternatively, a plurality of crystalline oxide semiconductor layers with different crystal structures may be included. Moreover, a plurality of amorphous oxide semiconductor layers may be included. In the case where the oxide semiconductor layer 7c has a two-layer structure including an upper layer and a lower layer, it is preferable that the oxide semiconductor that is contained in the upper layer has an energy gap which is greater than the energy gap of the oxide semiconductor that is contained in the lower layer. However, when the difference between the energy gaps of these layers is relatively small, the energy gap of the oxide semiconductor of the lower layer may be greater than the energy gap of the oxide semiconductor of the upper layer.

Materials, structures, film formation methods, and the like of amorphous oxide semiconductors and the aforementioned crystalline oxide semiconductors, the construction of an oxide semiconductor layer having a multilayer structure, and the like are described in Japanese Laid-Open Patent Publication No. 2014-007399, for example. The entire disclosure of Japanese Laid-Open Patent Publication No. 2014-007399 is incorporated herein by reference.

The oxide semiconductor layer 7c may contain at least one metallic element among In, Ga, and Zn, for example. In the present embodiment, the oxide semiconductor layer 7c contains an In—Ga—Zn—O based semiconductor (e.g., indium gallium zinc oxide), for example. Herein, the In—Ga—Zn—O based semiconductor is a ternary oxide of In (indium), Ga (gallium), and Zn (zinc). The ratio between In, Ga, and Zn (composition ratio) is not particularly limited, and includes In:Ga:Zn=2:2:1, In:Ga:Zn=1:1:1, In:Ga:Zn=1:1:2, and the like, for example. Such an oxide semiconductor layer 7c may be made of an oxide semiconductor film containing an In—Ga—Zn—O based semiconductor.

The In—Ga—Zn—O based semiconductor may be amorphous or crystalline. As a crystalline In—Ga—Zn—O based semiconductor, a crystalline In—Ga—Zn—O based semiconductor whose c axis is oriented generally perpendicular to the layer plane is preferable.

Note that the crystal structure of a crystalline In—Ga—Zn—O based semiconductor is disclosed in, for example, Japanese Laid-Open Patent Publication No. 2014-007399, supra, Japanese Laid-Open Patent Publication No. 2012-134475, Japanese Laid-Open Patent Publication No. 2014-209727, and so on. The entire disclosure of Japanese Laid-Open Patent Publication No. 2012-134475 and Japanese Laid-Open Patent Publication No. 2014-209727 is incorporated herein by reference. A TFT having an In—Ga—Zn—O based semiconductor layer has a high mobility (more than 20 times that of an a-Si TFT) and a low leak current (less than 1/100 of that of an a-Si TFT), and is suitably used as a driving TFT (e.g., a TFT that is included in a driving circuit which is provided around a displaying region that includes a plurality of pixels and on the same substrate as the displaying region) or a pixel TFT (a TFT which is provided in a pixel).

The oxide semiconductor layer 7c may contain other oxide semiconductors instead of an In—Ga—Zn—O based semiconductor. For example, it may contain an In—Sn—Zn—O based semiconductor (e.g., $In_2O_3$—$SnO_2$—ZnO; InSnZnO). An In—Sn—Zn—O based semiconductor is a ternary oxide of In (indium), Sn (tin), and Zn (zinc). Alternatively, the oxide semiconductor layer 7c may contain an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, a Ga—Zn—O based semiconductor, an In—Ga—Zn—Sn—O based semiconductor, or the like.

Active matrix substrates according to embodiments of the present invention are broadly applicable to display devices such as liquid crystal display devices, organic electroluminescence (EL) display devices, and inorganic electroluminescence display devices; imaging devices such as image sensor devices; image input devices; fingerprint reader devices; or other electronic devices.

This application is based on U.S. Provisional Application No. 62/692,922 filed on Jul. 2, 2018, the entire contents of which are hereby incorporated by reference.

What is claimed is:

1. An active matrix substrate having a displaying region that includes a plurality of pixel regions and a non-displaying region excluding the displaying region, the active matrix substrate comprising:
   a substrate;
   a plurality of source bus lines extending along the first direction and a plurality of gate bus lines extending along a second direction which intersects the first direction, the source bus lines and the gate bus lines being supported on the substrate; and
   a thin film transistor disposed in each of the plurality of pixel regions, wherein,
   each thin film transistor includes a gate electrode, an oxide semiconductor layer disposed on the gate electrode via a gate insulating layer, and a source electrode and a drain electrode being disposed on the oxide semiconductor layer and electrically connected to the oxide semiconductor layer;
   the plurality of gate bus lines and the gate electrode are made of a first electrically conductive film;
   at least part of each of the plurality of source bus lines, the source electrode, and the drain electrode have a multilayer structure including a lower layer that is made of a second electrically conductive film and an upper layer that is made of a first transparent electrically conductive film;
   the active matrix substrate
   further includes a pixel electrode disposed in each of the plurality of pixel regions and a common electrode disposed on the pixel electrode via an interlevel insulating layer, the pixel electrode being made of the first transparent electrically conductive film and the common electrode being made of a second transparent electrically conductive film; or further includes, in each of the plurality of pixel regions, a pixel electrode disposed on the thin film transistor via an interlevel insulating layer, the pixel electrode being made of a second transparent electrically conductive film; and
   a plurality of first oxide strips are disposed between the plurality of source bus lines and the gate insulating layer, the plurality of first oxide strips being made of a same oxide semiconductor film as the oxide semiconductor layer and extending along the first direction, and in each of the plurality of source bus lines, the lower layer is located on an upper face of one corresponding first oxide strip among the plurality of first oxide strips, and the upper layer covers an upper face and a side face of the lower layer and a side face of the one corresponding first oxide strip and is in contact with the gate insulating layer.

2. The active matrix substrate of claim 1, further comprising a plurality of source-gate connecting portions disposed in the non-displaying region, wherein,
each of the plurality of source-gate connecting portions includes
a gate connecting portion made of the first electrically conductive film,
a source connecting portion having the multilayer structure,
a second oxide strip being disposed between the source connecting portion and the gate insulating layer, and being made of the oxide semiconductor film, and
an upper connecting portion being made of the second transparent electrically conductive film and connecting between the gate connecting portion and the source connecting portion;
the upper connecting portion is directly in contact with the gate connecting portion, the second oxide strip, and the source connecting portion, within an opening that is made in the interlevel insulating layer and the gate insulating layer; and
when viewed from a normal direction of the substrate, within the opening, an edge of the second oxide strip is located inward of an edge of the source connecting portion.

3. The active matrix substrate of claim 1, wherein at least one of the plurality of source bus lines includes a first source portion having the multilayer structure and a second source portion that includes the upper layer but not the lower layer.

4. The active matrix substrate of claim 1, wherein,
the pixel electrode is made of the second transparent electrically conductive film, and is in contact with the drain electrode within a pixel aperture that is made in the interlevel insulating layer,
the active matrix substrate further comprises an extension from the drain electrode,
the drain electrode and/or the extension includes a first drain portion having the multilayer structure and a second drain portion that includes the upper layer but not the lower layer.

5. The active matrix substrate of claim 1, wherein the interlevel insulating layer is a multilayer film including a silicon oxide layer that is in contact with a channel region of the oxide semiconductor layer and a silicon nitride layer that is disposed on the silicon oxide layer.

6. The active matrix substrate of claim 1, wherein the oxide semiconductor film comprises an In—Ga—Zn—O based semiconductor.

7. The active matrix substrate of claim 6, wherein the In-Ga—Zn-O based semiconductor includes a crystalline portion.

8. An active matrix substrate having a displaying region that includes a plurality of pixel regions and a non-displaying region excluding the displaying region, the active matrix substrate comprising:
a substrate;
a plurality of source bus lines extending along the first direction and a plurality of gate bus lines extending along a second direction which intersects the first direction, the source bus lines and the gate bus lines being supported on the substrate; and
a thin film transistor disposed in each of the plurality of pixel regions, wherein,
each thin film transistor includes a gate electrode, an oxide semiconductor layer disposed on the gate electrode via a gate insulating layer, and a source electrode and a drain electrode being disposed on the oxide semiconductor layer and electrically connected to the oxide semiconductor layer;
the plurality of gate bus lines and the gate electrode are made of a first electrically conductive film;
at least part of each of the plurality of source bus lines, the source electrode, and the drain electrode have a multilayer structure including a lower layer that is made of a second electrically conductive film and an upper layer that is made of a first transparent electrically conductive film;
the active matrix substrate
further includes a pixel electrode disposed in each of the plurality of pixel regions and a common electrode disposed on the pixel electrode via an interlevel insulating layer, the pixel electrode being made of the first transparent electrically conductive film and the common electrode being made of a second transparent electrically conductive film; or further includes, in each of the plurality of pixel regions, a pixel electrode disposed on the thin film transistor via an interlevel insulating layer, the pixel electrode being made of a second transparent electrically conductive film;
a plurality of first oxide strips are disposed between the plurality of source bus lines and the gate insulating layer, the plurality of first oxide strips being made of a same oxide semiconductor film as the oxide semiconductor layer and extending along the first direction, each of the plurality of source bus lines being located on an upper face of one corresponding first oxide strip among the plurality of first oxide strips, and a width of the each of the plurality of source bus lines along the second direction is smaller than a width of the one corresponding first oxide strip along the second direction,
the active matrix substrate further includes a plurality of source-gate connecting portions disposed in the non-displaying region, wherein,
each of the plurality of source-gate connecting portions includes
a gate connecting portion made of the first electrically conductive film,
a source connecting portion having the multilayer structure,
a second oxide strip being disposed between the source connecting portion and the gate insulating layer, and being made of the oxide semiconductor film, and
an upper connecting portion being made of the second transparent electrically conductive film and connecting between the gate connecting portion and the source connecting portion;
the upper connecting portion is directly in contact with the gate connecting portion, the second oxide strip, and the source connecting portion, within an opening that is made in the interlevel insulating layer and the gate insulating layer; and
when viewed from a normal direction of the substrate, within the opening, an edge of the second oxide strip is located inward of an edge of the source connecting portion.

9. The active matrix substrate of claim 8, wherein the upper connecting portion is disposed only within the opening, and is not in contact with an upper face of the interlevel insulating layer.

10. The active matrix substrate of claim 8, wherein,
the pixel electrode is made of the second transparent electrically conductive film, and is in contact with the drain electrode within a pixel aperture that is made in the interlevel insulating layer,
the active matrix substrate further comprises an extension from the drain electrode,
the drain electrode and/or the extension includes a first drain portion having the multilayer structure and a second drain portion that includes the upper layer but not the lower layer.

11. The active matrix substrate of claim 8, wherein the interlevel insulating layer is a multilayer film including a silicon oxide layer that is in contact with a channel region of the oxide semiconductor layer and a silicon nitride layer that is disposed on the silicon oxide layer.

12. The active matrix substrate of claim 8, wherein the oxide semiconductor film comprises an In—Ga—Zn—O based semiconductor.

13. A method of producing the active matrix substrate of claim 8, wherein,
patterning of the first electrically conductive film is performed through a first photolithography step using a first photomask;
a first patterning of the second electrically conductive film and patterning of the oxide semiconductor film are performed through a second photolithography step using a second photomask;
patterning of the first transparent electrically conductive film and a second patterning of the second electrically conductive film are performed through a third photolithography step using a third photomask;
patterning of the interlevel insulating layer and the gate insulating layer is performed through a fourth photolithography step using a fourth photomask, by utilizing the second oxide strips as etchstops; and
patterning of the second transparent electrically conductive film is performed through a fifth photolithography step using a fifth photomask.

14. An active matrix substrate having a displaying region that includes a plurality of pixel regions and a non-displaying region excluding the displaying region, the active matrix substrate comprising:
a substrate;
a plurality of source bus lines extending along the first direction and a plurality of gate bus lines extending along a second direction which intersects the first direction, the source bus lines and the gate bus lines being supported on the substrate; and
a thin film transistor disposed in each of the plurality of pixel regions, wherein,
each thin film transistor includes a gate electrode, an oxide semiconductor layer disposed on the gate electrode via a gate insulating layer, and a source electrode and a drain electrode being disposed on the oxide semiconductor layer and electrically connected to the oxide semiconductor layer;
the plurality of gate bus lines and the gate electrode are made of a first electrically conductive film;
at least part of each of the plurality of source bus lines, the source electrode, and the drain electrode have a multilayer structure including a lower layer that is made of a second electrically conductive film and an upper layer that is made of a first transparent electrically conductive film;
the active matrix substrate
further includes a pixel electrode disposed in each of the plurality of pixel regions and a common electrode disposed on the pixel electrode via an interlevel insulating layer, the pixel electrode being made of the first transparent electrically conductive film and the common electrode being made of a second transparent electrically conductive film; or further includes, in each of the plurality of pixel regions, a pixel electrode disposed on the thin film transistor via an interlevel insulating layer, the pixel electrode being made of a second transparent electrically conductive film;
a plurality of first oxide strips are disposed between the plurality of source bus lines and the gate insulating layer, the plurality of first oxide strips being made of a same oxide semiconductor film as the oxide semiconductor layer and extending along the first direction, each of the plurality of source bus lines being located on an upper face of one corresponding first oxide strip among the plurality of first oxide strips, and a width of the each of the plurality of source bus lines along the second direction is smaller than a width of the one corresponding first oxide strip along the second direction, and
wherein at least one of the plurality of source bus lines includes a first source portion having the multilayer structure and a second source portion that includes the upper layer but not the lower layer.

15. The active matrix substrate of claim 14, wherein the first source portion is located in the non-displaying region, and the second source portion is located in the displaying region.

16. The active matrix substrate of claim 14, wherein, in each of the plurality of source bus lines, when viewed from a normal direction of the substrate, the first source portion is disposed in a region that is located between adjacent ones of the plurality of gate bus lines, and the second source portion is disposed in a region that intersects the plurality of gate bus lines.

17. The active matrix substrate of claim 14, wherein,
the pixel electrode is made of the second transparent electrically conductive film, and is in contact with the drain electrode within a pixel aperture that is made in the interlevel insulating layer,
the active matrix substrate further comprises an extension from the drain electrode,
the drain electrode and/or the extension includes a first drain portion having the multilayer structure and a second drain portion that includes the upper layer but not the lower layer.

18. The active matrix substrate of claim 14, wherein the interlevel insulating layer is a multilayer film including a silicon oxide layer that is in contact with a channel region of the oxide semiconductor layer and a silicon nitride layer that is disposed on the silicon oxide layer.

19. The active matrix substrate of claim 14, wherein the oxide semiconductor film comprises an In—Ga—Zn—O based semiconductor.

20. The active matrix substrate of claim 19, wherein the In—Ga—Zn—O based semiconductor includes a crystalline portion.

* * * * *